United States Patent
Suzaki et al.

(10) Patent No.: US 7,683,712 B2
(45) Date of Patent: Mar. 23, 2010

(54) WIRELESS FREQUENCY POWER AMPLIFIER, SEMICONDUCTOR DEVICE, AND WIRELESS FREQUENCY POWER AMPLIFICATION METHOD

(75) Inventors: Hidefumi Suzaki, Shiga (JP); Junji Ito, Osaka (JP); Fumiya Kamimura, Osaka (JP); Shigeki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 232 days.

(21) Appl. No.: 12/052,857

(22) Filed: Mar. 21, 2008

(65) Prior Publication Data

US 2008/0231368 A1 Sep. 25, 2008

(30) Foreign Application Priority Data

Mar. 23, 2007 (JP) .............................. 2007-076768

(51) Int. Cl.
H03G 9/00 (2006.01)
(52) U.S. Cl. ...................... 330/133; 330/129; 330/278; 330/310
(58) Field of Classification Search .................. 330/133, 330/129, 278, 310
See application file for complete search history.

(56) References Cited

U.S. PATENT DOCUMENTS

| 5,182,527 | A | * | 1/1993 | Nakanishi et al. ........... 330/285 |
| 6,252,455 | B1 | * | 6/2001 | Kurby et al. ................. 330/136 |
| 6,278,328 | B1 | | 8/2001 | Yamamoto et al. |
| 6,967,533 | B2 | * | 11/2005 | Vilhonen et al. ............. 330/254 |
| 7,042,285 | B2 | * | 5/2006 | Parkhurst et al. ............ 330/140 |
| 7,053,708 | B2 | * | 5/2006 | Nagamori et al. ........... 330/133 |
| 7,382,193 | B2 | * | 6/2008 | Osman et al. ................ 330/278 |
| 2002/0033735 | A1 | | 3/2002 | Hasegawa et al. |
| 2004/0135633 | A1 | | 7/2004 | Akamine et al. |

FOREIGN PATENT DOCUMENTS

| JP | 2000-341052 A | 12/2000 |
| JP | 2002-84144 A | 3/2002 |
| JP | 2004-140633 A | 5/2004 |
| JP | 2005-45471 A | 2/2005 |

* cited by examiner

Primary Examiner—Patricia Nguyen
(74) Attorney, Agent, or Firm—RatnerPrestia

(57) ABSTRACT

A differential amplifier circuit is connected to the input node and the output node of the final amplification stage through detection circuits. The signal level difference output from the differential amplifier circuit does not change even if the input power varies. Because a change in the power gain at the output node does not travel back to the input node when the load impedance of the wireless frequency power amplifier varies, it is possible to detect only the change in the load impedance. Damage to the final stage can be prevented by controlling the operating current of the final stage and the gain of the drive stage according to the detected load variation. Nonlinear distortion in the wireless frequency power amplifier output can also be reduced by detecting and canceling the change in the gain of the drive stage by changing the gain of the adjustment stage.

24 Claims, 20 Drawing Sheets

WIRELESS FREQUENCY POWER AMPLIFIER, SEMICONDUCTOR DEVICE, AND WIRELESS FREQUENCY POWER AMPLIFICATION METHOD

BACKGROUND OF THE INVENTION

1. Field of Invention

The present invention relates to technology for amplifying wireless frequency signals in mobile wireless communication devices such as cell phones that are small, lightweight, and low current consumption, and more particularly relates to technology for a wireless frequency power amplifier, a semiconductor device, and a wireless frequency power amplification method.

2. Description of Related Art

Mobile wireless communication devices such as cell phones have a wireless frequency power amplifier which enables amplification of high frequency signals. Output signals of the high frequency power amplifier are transmitted to a base station through the antenna of the mobile wireless communication devices. The high frequency power amplifier is required to be small, inexpensive, and low current consumption. High performance transistors such as GaAs-FET (gallium arsenide field-effect transistors), HBT (heterojunction bipolar transistors), and silicon germanium HBT (SiGe-HBT) enable more efficient high frequency amplification than other semiconductor devices.

The wireless frequency power amplifier is used to amplify the modulated high frequency signals to 100 to 1000 times higher output power level, and the amplified signals are transmitted through the antenna. The wireless frequency power amplifier consists of cascaded amplifies in order to obtain higher gain performance. In each of these cascaded amplifiers, high performance transistors as described above are used. The amplified signals at the each amplification stage of the cascaded amplifies are input to the next amplification stage, and output power level of the final stage amplifier reaches to approximately 1 W.

The output terminal of the high frequency power amplifier is terminated to the antenna. One end of the antenna is attached to the cell phone, but the other end is terminated to open space. If shielded materials which consist of metal or other conductors come close to the antenna, the high frequency power amplifier is mismatched because of the impedance fluctuation of the antenna. This fluctuation degrades the reliability of the high frequency power amplifier performance. This fluctuation can also cause the undesirable oscillations of the final amplification stage transistor, resulting in transistor failure due to excessive heating.

Higher linearity operation is required in the wireless frequency power amplifier used in CDMA (code division multiplex access), W-LAN (wireless local area network), and other types of digital modulation system that are commonly used in modern cell phones and wireless devices because of the amplitude and phase change contained in the modulated signals. The impedance fluctuation noted above affects the high linearity operation of the high frequency power amplifier and causes unstable operation of the high performance transistors in the high frequency power amplifier. The unstable operation of the high performance transistors causes the distortion of the high frequency power amplifier, resulting in the degradation of the transmission performance of the cell phones and wireless devices.

To avoid this problem, cell phones use an isolator, a circulator, or other components which have unilateral characteristics of signal transmission. By inserting such a unilateral component between the wireless frequency power amplifier and the antenna to isolate the output terminal of the wireless frequency power amplifier from the input terminal of the antenna, signals do not return from the antenna to the wireless frequency power amplifier, and impedance fluctuation at the antenna is not observed at the output terminal of the wireless frequency power amplifier. However, isolators, circulators, and other such unilateral components include a magnet, ferrite, or other such material, imposing a significant limitation on the size and weight reduction and degree of integration that can be achieved. With priority given to reduced size and price, unilateral components such as noted above are increasingly omitted from newer cell phones.

FIG. 12 shows an example of the transmission/reception circuit unit for the wireless frequency that is used in a W-CDMA (Wideband-CDMA) cell phone. Transmission from the modulation/demodulation block passes a filter 90 and is input to the wireless frequency power amplifier 92. An isolator 93 is connected to the output node of the wireless frequency power amplifier 92. The isolator 93 is connected to the antenna 95 through a wireless frequency switch 94.

FIG. 13 shows a power amplifier protection circuit described in U.S. Pat. No. 6,278,328 B1 (corresponding to Japanese Laid-open Patent Publication No. 2000-341052). When a greater than predetermined voltage is applied to the collector of the last stage transistor, this protection circuit supplies a feedback current through a device disposed between the base and collector of the final transistor, and can thereby protect the wireless frequency power amplifier without using an isolator.

FIG. 14 shows a wireless communication system with electronic components for wireless frequency amplification as taught in U.S. Patent Application Publication No. 2004/0135633 A1 (corresponding to Japanese Laid-open Patent Publication No. 2004-140633). This system has a capacitance device inserted between the output node of the transistor used in the last stage for wireless frequency signal amplification, and the gate node of the transistor in the current mirror circuit of the output level detection circuit ODT, and reflects variation in the output power accompanying fluctuation in the antenna impedance in the detection current of the output level detection circuit.

Japanese Laid-open Patent Publication No. 2005-045471 teaches connecting a separate detection circuit to the input node and output node of the power amplifier circuit, and comparing the outputs of the two detection circuits with a comparator to detect the gain fluctuation. By controlling the gain of the amplification circuit based on this gain fluctuation, the linearity of the amplification circuit can be improved.

One conventional technology for rendering a W-CDMA cell phone is to incorporate a wireless frequency power amplifier in the transmitter/receiver circuit unit rendered as shown in FIG. 12. This arrangement does not have a protection circuit for protection against impedance fluctuations in the antenna 95 incorporated in the wireless frequency power amplifier 92. The isolator 93 must be connected in order to maintain the transmission quality of the cell phone and to enable stable operation. However, because the isolator 93 includes ferrite or a permanent magnet, for example, the isolator 93 interferes not only with reducing the size but also reducing the weight of the cell phone or other mobile communication device.

Electrically, loss in the forward transmittance characteristic is preferably 0 dB, but in reality loss is typically from 0.5 dB to 1.0 dB. The isolator 93 is inserted between the wireless frequency power amplifier 92 and the antenna 95, and this makes it necessary to increase the output level of the wireless frequency power amplifier 92 in order to compensate for power consumption by the isolator 93. This is a factor increasing the power consumption of the wireless frequency power amplifier, which either shortens the connection time of the cell phone or requires increasing the battery capacity.

The power amplifier protection circuit taught in U.S. Pat. No. 6,278,328 B1 was proposed to solve the foregoing problem (see FIG. 13). When the load terminated at the output terminal of the wireless frequency power amplifier fluctuates, a voltage exceeding a predetermined threshold level applied to the collector tries to activate the protection circuit. Technology including this protection circuit is, however, referenced for application in the second-generation digital cell phone network system standardized in Europe, commonly known as the Global System for Mobile Communications (GSM).

An alternative technology of the related art is taught in U.S. Patent Application Publication No. 2004/0135633 A1. This technology disposes a current mirror circuit to the transistor in the final stage, and tries to protect the wireless frequency power amplifier by detecting the current variations that occur in conjunction with antenna impedance fluctuations (see FIG. 14). This technology is only referenced in the GSM system and the similar Digital Cellular System (DCS).

In addition, while both disclosures address protecting the wireless frequency power amplifier from damage due to load variation, they are silent about the adverse effects on adjacent channels caused by degraded modulation precision in the modulation signals and increased signal distortion, and otherwise compensating for degraded transmission quality.

Amplitude variation is not included in the output modulation signal with the modulation methods that are used in the GSM and DCS systems. With the technologies taught in the above-noted examples of the related art, a change from a state in which the antenna is normally terminated to a state in which the load fluctuates can be detected by monitoring change in the power, voltage, or current of the wireless frequency signal at the collector node of the final-stage signal transistor. However, with digital modulation systems, such as W-CDMA, CDMA, PDC (personal digital cellular), EDGE (enhanced data GSM environment), and WLAN, the modulated signal always includes amplitude change in the signal level, and the technologies cited above cannot differentiate amplitude change in the modulated signal and amplitude change caused by load fluctuation.

FIG. 15, FIG. 16A, FIG. 16B, FIG. 17A, and FIG. 17B show the input/output characteristic of a prior art wireless frequency power amplifier with 50-Ω termination. As shown in FIG. 15, FIG. 16A, and FIG. 16B, the current amplitude waveform at the collector (FIG. 16B) and the voltage amplitude waveform applied to the collector (FIG. 16A) are constant in the saturation range because the output power is constant for the input signal level. However, as shown in FIG. 15, FIG. 17A, and FIG. 17B, the output power changes according to the power level of the input signal in the unsaturated range, and the current amplitude waveform to the collector (FIG. 17B) and the voltage amplitude waveform applied to the collector (FIG. 17A) therefore also change.

Amplitude variation is not contained in the modulation signal in the GSM and DCS methods, and the wireless frequency power amplifier can therefore be operated in the saturation range. In addition, because there is no amplitude variation in the input signal, the output power is constant, and the current amplitude and voltage amplitude of the collector are also stable at a constant level. If the antenna impedance fluctuates and the operating state of the wireless frequency power amplifier changes under these conditions, the amount of the change of the observed output power, current amplitude, and voltage amplitude at the terminal of the wireless frequency power amplifier can also be detected as due to load fluctuation.

In a digital modulation system such as W-CDMA that uses the wireless frequency power amplifier in the unsaturated region, the input modulation signal includes amplitude variation as the modulated signals even during normal operation with 50-Ω termination. The output power, current amplitude, and voltage amplitude are therefore always changing and never constant. As a result, when the antenna impedance changes and the operating state of the wireless frequency power amplifier changes, variation caused by load fluctuations cannot be electrically detected from the change in the output power, current amplitude, and voltage amplitude detected at the collector node of the transistor in the last stage.

The arrangement taught in Japanese Laid-open Patent Publication No. 2005-045471 detects change in gain from the input/output terminals of the power amplification circuit. The gain of the power amplification circuit cannot be accurately detected, however, if there is a nearby metal shield, for example, that causes the terminal impedance of the antenna connected to the output terminal of the power amplification circuit to vary. As a result, not only can linearity not be improved, but the gain of the preceding stage increases if the power detected at the output terminal decreases because of the variation in the terminal impedance of the antenna, and the transistor in the preceding stage may fail. Furthermore, because the gain of the input/output terminals of the power amplification circuit is set high, normally about 30-40 dB, detection error increases in the gain detected from the input/output terminals, and there is insufficient improvement in linearity.

SUMMARY OF THE INVENTION

The present invention is directed to solving the foregoing problems of the prior art, and an object of the invention is to stabilize the operation of a wireless frequency power amplifier that amplifies modulation signals containing amplitude fluctuation by effectively detecting fluctuation in the load impedance, and improve the linearity of the amplifier by effectively detecting non-linear amplifier operation.

To achieve the foregoing object, a wireless frequency power amplifier according to the present invention has a first amplification stage that amplifies a first modulation signal to a second modulation signal, a second amplification stage that amplifies the second modulation signal to a third modulation signal, and a gain change detection unit that detects change in the gain of the second amplification stage and outputs a gain change detection signal based on the second modulation signal and the third modulation signal, wherein the gain of at least one of the first amplification stage and the second amplification stage changes based on the gain change detection signal.

A semiconductor device according to another aspect of the invention renders the wireless frequency power amplifier of the invention in one chip.

A wireless frequency power amplification method according to another aspect of the invention has amplifying a first modulation signal to a second modulation signal, amplifying the second modulation signal to a third modulation signal, and detecting change in the gain in amplifying to the third modulation signal and generating a gain change detection signal based on the second modulation signal and the third modulation signal, wherein the gain in at least one of amplifying to the second modulation signal and amplifying to the third modulation signal changes based on the gain change detection signal.

Without using an isolator or other unilateral component in a W-CDMA or similar wireless frequency power amplifier that amplifies a digital modulation signal containing amplitude variation in the modulated signal, the wireless frequency power amplifier, the semiconductor device, and the wireless frequency power amplification method according to the present invention can protect the wireless frequency power amplifier from damage due to large power fluctuations caused by load fluctuation, and can thus provide a wireless frequency power amplifier that is small, lightweight and operates stably with low current consumption.

The invention can also prevent degraded modulation precision in the modulation signal and an increase in the distortion component of the signal wave from adversely affecting adjacent channels, and thereby achieves a wireless frequency power amplifier with high signal transmission quality.

The operation of the wireless frequency power amplifier and mobile devices using the wireless frequency power amplifier can thus be stabilized.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
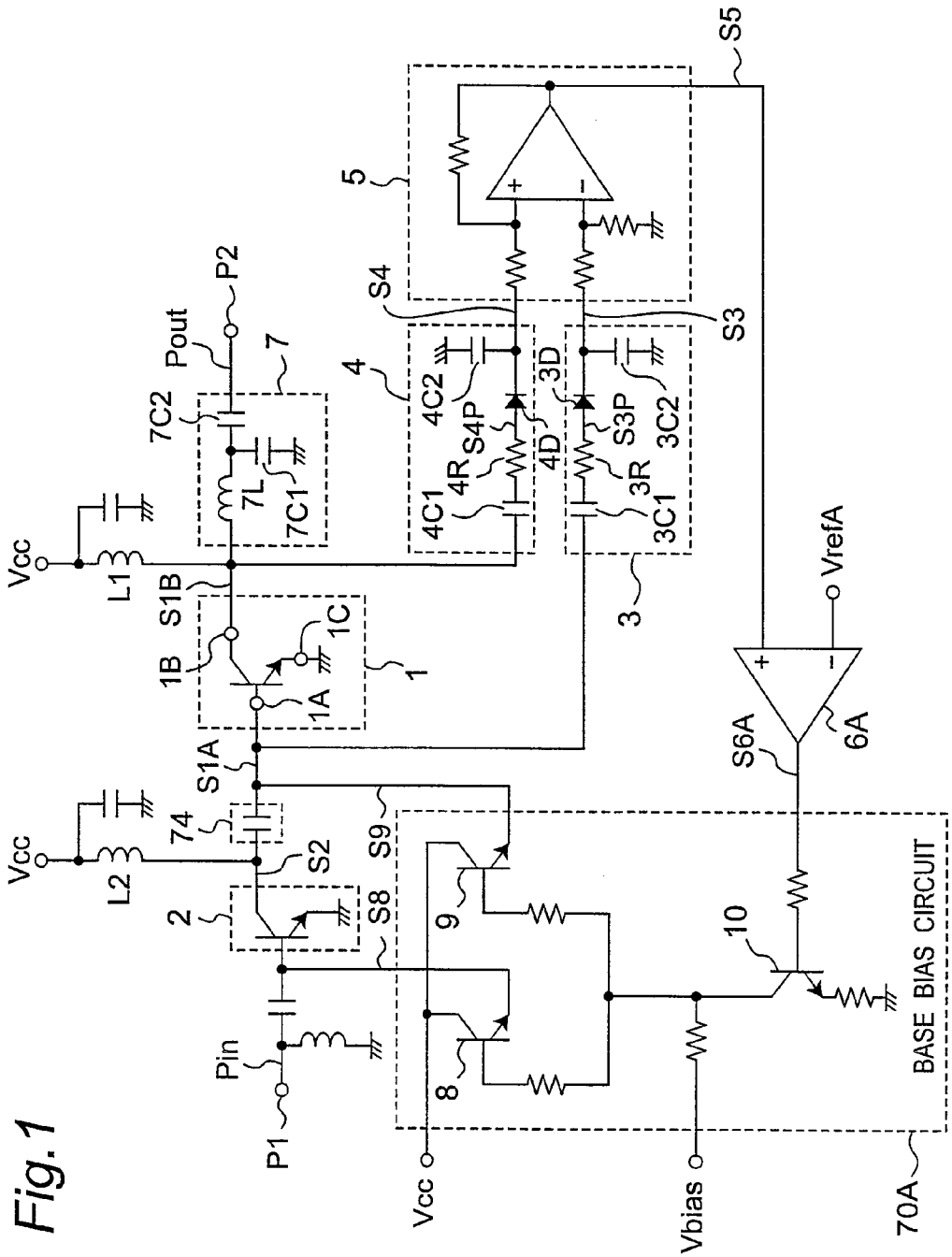
FIG. 1 is a circuit diagram showing the arrangement of a wireless frequency power amplifier according to a first embodiment of the invention.

Preferred embodiments of the present invention are described below with reference to the accompanying figures. Note that components with the same arrangement, operation, and effect are denoted by the same reference numerals in the accompanying figures. The numbers used below and in the figures are also merely to describe a specific embodiment of the invention, and the invention is not limited to the cited numbers. In addition, logic levels denoted high and low, and switch states denoted on and off, are also only used by way of example to describe a specific embodiment of the invention, and it will be obvious that the same effect can be achieved using different combinations of the exemplary logic levels and switching states cited below. Furthermore, the connections between particular components described below are also used to describe a specific embodiment of the invention, and the connections achieving the function of the invention are not limited to those described below. The following embodiments are also rendering using hardware and/or software elements, but the hardware arrangements described below can also be achieved using software, and the software constructions described below can also be achieved using hardware.

Embodiment 1

FIG. 1 is an equivalent circuit diagram showing an example of a wireless frequency power amplifier according to a first embodiment of the invention. As shown in FIG. 1 the wireless frequency power amplifier according to this first embodiment has a transistor 1, a matching circuit 7, and a drive stage 2. An amplifier input signal Terminal is input to the amplifier input node P1. The transistor 1 is also referred to as final stage 1 or amplification stage 1 below. The drive stage 2 is also referred to as amplification stage 2, and the amplifier input signal Terminal is also referred to as a modulation signal.

The modulation signal is generated by modulating a carrier wave with a signal to be modulated based on the modulation method. In the case of a cell phone the signal to be modulated is a voice signal or an Internet data signal, and is an Internet data signal in the case of a wireless local area network (WLAN). In this case, the phase and amplitude of the modulation signal vary according to the signal being modulated when the signal is modulated for CDMA (code division multiplex access). The frequency band of the modulation signal is from 800 MHz to 2 GHz in the case of a cell phone signal, and from 2.4 GHz to more than 5 GHz in the case of a WLAN signal. The wireless frequency power amplifier according to this first embodiment of the invention amplifies a modulation signal containing amplitude variation in such a frequency band.

The amplifier input signal Terminal is input to the base of a transistor that is contained in the drive stage 2 with its emitter to ground, is amplified by the drive stage 2 to a drive stage output signal S2, and is output from the collector. This drive stage output signal S2 is also referred to as a modulation signal, the base is also called the input node, the emitter is also called the common node, and the collector is also called the output node. The drive stage output signal S2 is passed through and output by the matching circuit 74 transistor input signal S1A, and is input to the input node 1A of the transistor 1. The transistor input signal S1A is also referred to as the final stage input signal or modulation signal, and the input node 1A is also called simply an input node. The matching circuit 74 is rendered by a single capacitance, for example, matches the input/output impedance, and converts the drive stage output signal S2 to the transistor input signal S1A. The matching circuit 74 also functions as a coupling capacitance.

The emitter-grounded transistor 1, that is, is connected with the emitter 1C to ground, amplifies input signal S1A to the transistor output signal S1B, and outputs the transistor output signal S1B from the collector 1B.

The transistor output signal S1B is also called the final stage output signal or modulation signal, the emitter 1C is also called the common node, and the collector 1B is also called the output node. The transistor output signal S1B is output through the matching circuit 7 as amplifier output signal Pout from the amplifier output node P2, and is supplied to an antenna not shown. The amplifier output signal Pout is also called a modulation signal.

The transistor 1 thus inputs the transistor input signal S1A between the input node 1A and common node 1C, amplifies the modulation signal S1A to modulation signal S1B, and outputs the modulation signal S1B from between the output node 1B and the common node 1C. The power supply voltage Vcc is supplied from the circuit power supply through the inductance loads L2 and L1 to the collector of the drive stage 2 and the collector 1B of the transistor 1.

The matching circuit 7 includes an inductance 7L of which one side is connected to the input node, a capacitance 7C1 connected between the other side of the inductance 7L and ground, and another capacitance 7C2 connected between the other side of the inductance 7L and the output node. The matching circuit 7 matches the impedance of the input and output of the matching circuit 7, and converts the transistor output signal S1B to the amplifier output signal Pout. That is, the output impedance of the transistor 1 is matched to the 50-$\Omega$ transmission path impedance from the amplifier output node P2 to the antenna. The matching circuit 7 is also referred to herein as the matching unit.

A detection circuit 3 and another detection circuit 4 are connected to the transistor 1. The first detection circuit 3 outputs a detector output signal S3 denoting the level of the transistor input signal S1A, and the other detection circuit 4 outputs a detector output signal S4 denoting the level of the transistor output signal S1B. The detection circuit 3 detects the transistor input signal S1A in the frequency band that is amplified by the transistor 1, and converts the substantially dc voltage to the detector output signal S3. The detection circuit 4 detects the transistor output signal S1B in the frequency band amplified by the transistor 1, and converts the substantially dc voltage to the detector output signal S4. These detector output signals S3 and S4 are also referred to as simply detector signals.

The detection circuit 3 includes a capacitance 3C1, a resistance 3R, a rectification diode 3D, and a capacitance 3C2. The capacitance 3C1 is connected to the base 1A of the transistor 1, and blocks the dc component of the transistor input signal S1A. The resistance 3R is connected to the other side of the capacitance 3C1, and adjusts the attenuation of the signal level of the transistor input signal S1A. The anode of the rectification diode 3D is connected to the other side of the resistance 3R. The capacitance 3C2 is connected between the cathode of the rectification diode 3D and the ground, and allows the AC component to bypass.

The detection circuit 4 is identical to the detection circuit 3, and has a capacitance 4C1, a resistance 4R, a rectification diode 4D, and a capacitance 4C2. The capacitance 4C1 is connected to the collector 1B of the transistor 1, and blocks the dc component of the transistor output signal S1B. The resistance 4R is connected to the other side of the capacitance 4C1, and adjusts the attenuation of the signal level of the transistor output signal S1B. The anode of the rectification diode 4D is connected to the other side of the resistance 4R. The capacitance 4C2 is connected between the cathode of the rectification diode 4D and the ground, and allows the AC component to bypass.

To minimize loss of the transistor input signal S1A and transistor output signal S1B due to connection of the detection circuits 3 and 4, the capacitances 3C1 and 3C2 are set low. The detector output S3P appears between resistance 3R and rectification diode 3D, and detector output S4P appears between resistance 4R and rectification diode 4D. If the amplifier output node P2 is terminated at 50$\Omega$, that is, there is no variation in the load impedance described below, the resistance 4R is set greater than resistance 3R by an amount equal to the power gain of the transistor 1 so that detector outputs S3P and S4P are substantially equal to each other. In this case, the level of the detector output signal S3 for the ends of the capacitance 3C2, and the level of the detector output signal S4 for the ends of the capacitance 4C2, are substantially equal.

For example, if the power gain of the transistor 1 is 10×, the capacitances 3C1 and 4C1 are 1 pF, resistance 3R is 10Ω, and resistance 4R is 100Ω.

The detector output signal S3 and detector output signal S4 are respectively output from the inverted input terminal and the non-inverted input terminal of the differential amplifier circuit 5.

The differential amplifier circuit 5 outputs a gain change detection signal S5 that denotes the difference signal acquired by subtracting the detector output signal S3 from the detector output signal S4. The differential amplifier circuit 5 is not limited to a differential amplifier circuit, can be any block that functions to generate a difference signal for two input signals, and is therefore also referred to herein as a difference unit. If there is no variation in the load impedance, the detector output signals S3 and S4 are mutually equal and the gain change detection signal S5 is therefore substantially zero.

The arrangement including the detection circuit 3, the detection circuit 4, and the differential amplifier circuit 5 is also referred to as a gain change detection unit. The gain change detection unit detects the change in the power gain of the transistor 1 and generates the gain change detection signal S5 based on the transistor input signal S1A and the transistor output signal S1B. The gain change detection signal S5 increases linearly as the transistor 1 gain increases. The gain change detection unit can generate the gain change detection signal S5 based on the amplifier output signal Pout instead of the transistor output signal S1B. The gain change detection unit can also generate the gain change detection signal S5 based on the drive stage output signal S2 instead of the transistor input signal S1A.

The comparator 6A compares the gain change detection signal S5 with a predetermined reference voltage VrefA. If the gain change detection signal S5 is greater than reference voltage VrefA, the comparator 6A outputs comparator output voltage S6A. That is, the comparator output voltage S6A goes from low to high. The comparator 6A is also referred to as a comparison unit.

The comparator output voltage S6A is input to the base bias circuit 70A. The base bias circuit is also referred to as a bias signal generating unit. The comparator output voltage S6A is input to the base of transistor 10 in the base bias circuit 70A, and the collector output of the transistor 10 is input to the base of both transistors 8 and 9. A predetermined voltage Vbias that is lower than supply voltage Vcc is simultaneously supplied from the Vbias power supply to the base of both transistors 8 and 9. The supply voltage Vcc is supplied from a Vcc source to the collectors of both transistors 8 and 9, and base bias currents S8 and S9 are respectively output from the emitters of the transistors 8 and 9. The base bias currents S8 and S9 are respectively input to the base of the drive stage 2 and the base 1A of the transistor 1, and the current required for operation is supplied to the drive stage 2 and transistor 1. The dc input current of the transistor 1 contained in the transistor input signal S1A is equal to base bias current S9. The base bias current is also referred to as a bias signal.

When the comparator output voltage S6A is low, the base voltage of the transistors 8 and 9 in the base bias circuit 70A is set to the voltage Vbias so that the transistors are active, and sufficient base bias current S8 and S9 is respectively supplied to the drive stage 2 and transistor 1. When the comparator output voltage S6A goes high, transistor 10 goes on and the base voltage of the transistors 8 and 9 goes low, and the base bias currents S8 and S9 are thus digitally blocked.

Alternatively, the gain change detection signal S5 could be input directly to the base bias circuit 70A. This causes the base bias circuit 70A to become active and operate. More specifically, as the gain change detection signal S5 level rises, the collector voltage of the transistor 10 drops, the base voltage of the transistors 8 and 9 drops, and the base bias currents S8 and S9 therefore drop analogically.

Yet further alternatively, if the comparator 6A determines that the gain change detection signal S5 is greater than the reference voltage VrefA, the comparator 6A could output a comparator output voltage S6A that is proportional to the gain change detection signal S5. With this arrangement the base bias currents S8 and S9 are sufficiently supplied until the gain change detection signal S5 rises to reference voltage VrefA, and the base bias currents S8 and S9 decrease analogically when the gain change detection signal S5 exceeds the reference voltage VrefA.

For example, when the amplifier input signal Terminal is a modulation signal containing amplitude fluctuation as in a CDMA signal, both the transistor input signal S1A and the transistor output signal S1B fluctuate synchronously when there is no load fluctuation. The gain change detection signal S5 also goes substantially to zero as described above in this case.

However, variation in the load impedance at the amplifier output node P2 causes the power gain of the transistor 1 to vary. The transistor output signal S1B is directly affected and varies, but the transistor input signal S1A is on the other side of the transistor 1, is not affected, and does not vary. As a result, the voltage of the gain change detection signal S5 fluctuates with the load fluctuation.

The effect of amplitude variation in the modulation signal thus does not appear in the gain change detection signal S5, and only the effect of load variation appears. If the load variation is great, the base bias currents S8 and S9 are cut off or decrease. If the base bias current S8 is cut off or decreases, the signal amplitude of the drive stage output signal S2 decreases, and the signal amplitude of the transistor input signal S1A decreases. If the base bias current S9 is cut off or decreases, the dc component of the transistor input signal S1A decreases. As a result, if the base bias currents S8 and S9 are cut off or decrease (that is, drop below a predetermined level), the signal amplitude and dc component of the transistor input signal S1A decrease, and as a result the signal amplitude of the transistor output signal S1B also decreases. Yet more specifically, the gain of the drive stage 2 and the transistor 1 drops and signal amplification by the transistor 1 is stabilized.

As described above, when a wireless frequency power amplifier amplifies a CDMA or similar modulation signal containing amplitude variation, and the load impedance varies because the antenna is near an obstruction, both amplitude variation and load variation appear at the collector node 1B of the transistor 1. In this case, only load variation is detected in the gain change detection signal S5 generated by the detection circuits 3 and 4 and the differential amplifier circuit 5.

Therefore, when the gain change detection signal S5 rises above a predetermined level, the base bias circuit 70A is used to lower the base bias currents S8 and S9 to a predetermined level or below. This enables controlling the transistor input signal S1A and avoids applying an overcurrent or overvoltage to the collector node 1B of the transistor 1.

The wireless frequency power amplifier is thus protected from damage due to load fluctuation, and reliability is improved. Mobile devices in which the wireless frequency power amplifier is used can also be protected from heat damage caused by load fluctuations. In addition, the operation of the wireless frequency power amplifier and mobile devices using the wireless frequency power amplifier is stabilized. The size and weight of the mobile device can also be reduced because there is no need to use an isolator. Yet further, because there is no loss from insertion of an isolator, the power consumption of the wireless frequency power amplifier is reduced and the air time of the cell phone using the wireless frequency power amplifier can be increased.

The comparator 6A and base bias circuit 70A render a control unit. With this first embodiment of the invention, the transistor 1, the detection circuit 3, the detection circuit 4, the differential amplifier circuit 5, and the control unit can be rendered on a single semiconductor chip.

Embodiment 2

A wireless frequency power amplifier according to a second embodiment of the invention is described next. Primarily the differences between this embodiment and the first embodiment are described below. Other aspects of the arrangement, operation, and effect of this embodiment are the same as in the first embodiment, and further description thereof is therefore omitted.

Figure 2:
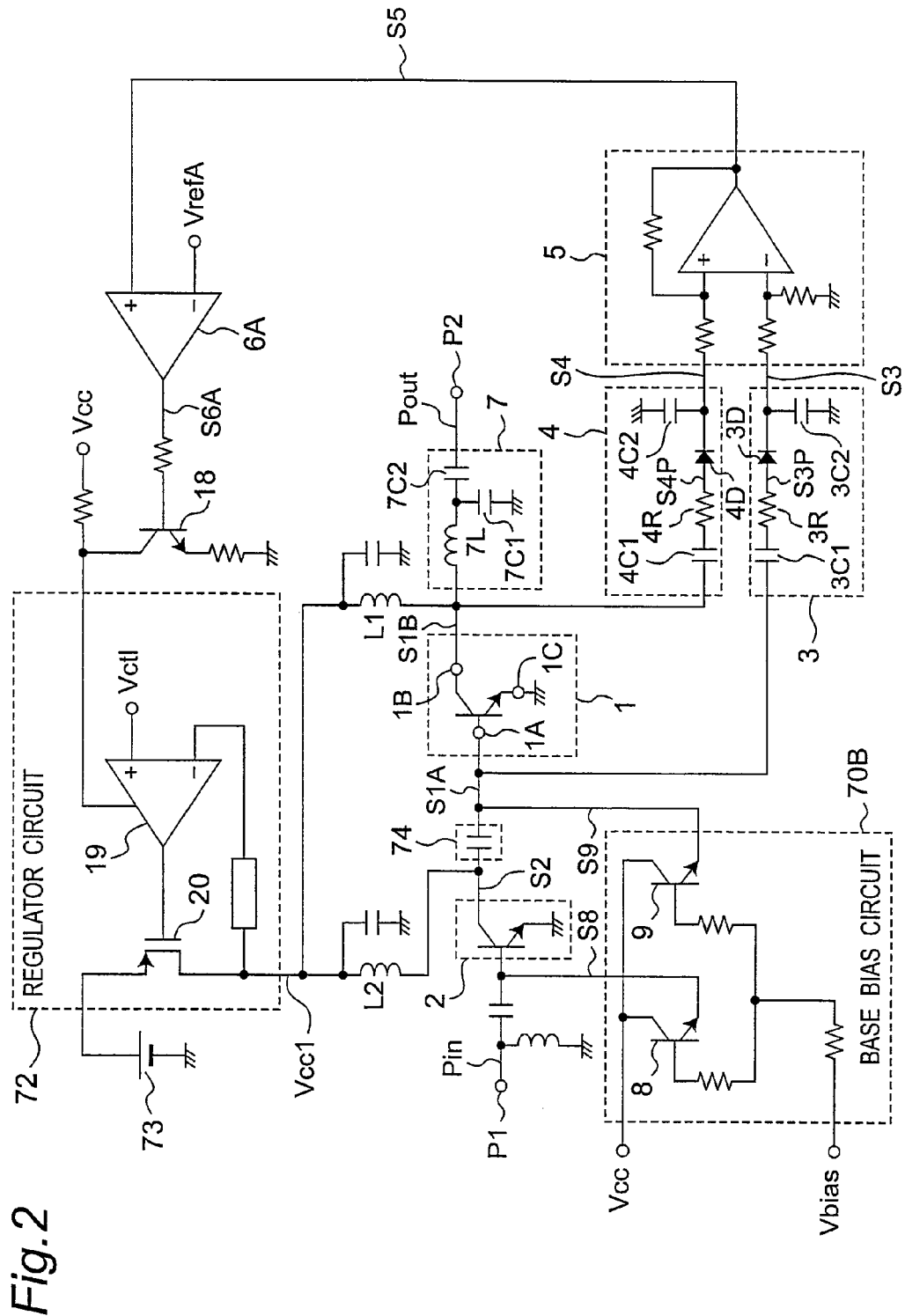
FIG. 2 is a circuit diagram showing the arrangement of a wireless frequency power amplifier according to a second embodiment of the invention.

FIG. 2 is an equivalent circuit diagram showing an example of a wireless frequency power amplifier according to a second embodiment of the invention. In the second embodiment as shown in FIG. 2, the base bias circuit 70B outputs predetermined base bias currents S8 and S9 based on a predetermined voltage Vbias without being controlled by the comparator output voltage S6A. In addition, the supply voltage Vcc1 is supplied from a battery 73 through a regulator circuit 72. The supply voltage Vcc1 contains the power supply current, and is therefore also referred to as dc power. The regulator circuit 72 is also referred to as a dc power generating unit.

The regulator circuit 72 includes a pMOS transistor 20 and an operating amplifier 19. The power supply current from the battery 73 is input to the source of the pMOS transistor 20, and the supply voltage Vcc1 is supplied from the drain. The operating amplifier 19 amplifies the voltage difference between the drain voltage input to the inverted input terminal and a predetermined control voltage Vct1 input to the non-inverted input terminal, and outputs to the gate of the transistor 20. When the supply voltage Vcc1 starts to rise, the voltage difference input to the operating amplifier 19 drops, the current flow to the pMOS transistor 20 drops, and the rise in the supply voltage Vcc1 is suppressed. More specifically, the regulator circuit 72 adjusts the supply voltage Vcc1 to a predetermined level based on the control voltage Vct1. The supply voltage Vcc1 is substantially equal to the supply voltage Vcc.

The comparator output voltage S6A is input to the base of the transistor 18. The emitter of the transistor 18 goes to ground through a resistance, the collector and the power supply node of the operating amplifier 19 are connected to a common node, and the supply voltage Vcc is supplied from the Vcc supply through a resistance. When the comparator output voltage S6A is low, the transistor 18 is off and the regulator circuit 72 adjusts the supply voltage Vcc1 to a predetermined level. When the comparator output voltage S6A is high, the transistor 18 turns on, the supply voltage of the operating amplifier 19 goes substantially to ground, and the pMOS transistor 20 turns off. More specifically, the supply voltage Vcc1 goes substantially to the ground voltage.

The current flow through the pMOS transistor 20 may rise to a maximum 2 A in some devices. The antenna may break, for example, and the change in the load impedance may exceed the normally anticipated range. This causes the transistor 1 to oscillate abnormally and an abnormal collector current to flow, an overcurrent to flow to the battery, and thermal failure. As a result, by applying the comparator output voltage S6A to stop operation of the regulator circuit 72 when the base bias circuit 70A cannot completely stop operation of the transistor 1, current flow from the battery 73 through the pMOS transistor 20 can be completely cut off.

Therefore, when the gain change detection signal S5 rises above a predetermined level, the regulator circuit 72 is used to stop the amplification operation of the transistor 1 and the drive stage 2. More specifically, the gain of the drive stage 2 and the transistor 1 goes substantially to zero. This enables controlling the transistor input signal S1A and the transistor output signal S1B to avoid an overcurrent and overvoltage at the collector 1B of the transistor 1. Operation of the transistor 1, the wireless frequency power amplifier, and a mobile device in which the wireless frequency power amplifier is used is therefore stabilized. This cut-off function makes the base bias current S8 and S9 cut-off function of the first embodiment even more reliable, and thus reliably achieves the same effect as the first embodiment.

The comparator 6A, the transistor 18, and the regulator circuit 72 render a control unit in this embodiment of the invention.

Embodiment 3

A wireless frequency power amplifier according to a third embodiment of the invention is described next. Primarily the differences between this embodiment and the first embodiment are described below. Other aspects of the arrangement, operation, and effect of this embodiment are the same as in the first embodiment, and further description thereof is therefore omitted.

Figure 3:
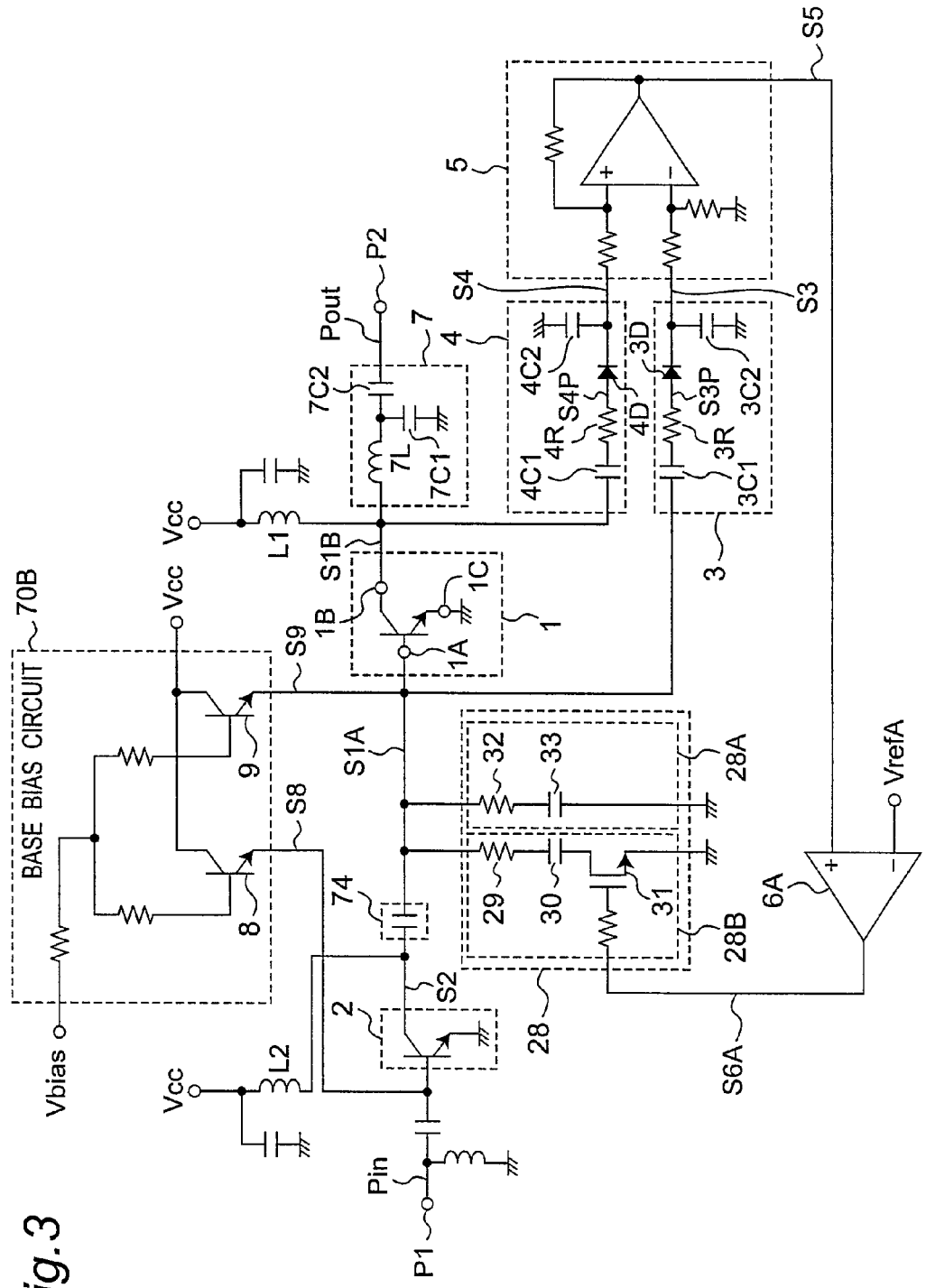
FIG. 3 is a circuit diagram showing the arrangement of a wireless frequency power amplifier according to a third embodiment of the invention.

FIG. 3 is an equivalent circuit diagram showing an example of a wireless frequency power amplifier according to a third embodiment of the invention. In the third embodiment as shown in FIG. 3, the base bias circuit 70B outputs predetermined base bias currents S8 and S9 based on a predetermined voltage Vbias without being controlled by the comparator output voltage S6A. In addition, the wireless frequency power amplifier also has a stabilization circuit 28 inserted between the input node 1A and the emitter node 1C (ground node) of the transistor 1. The arrangement including the stabilization circuit 28 and the transistor 1 is also referred to as the final stage or the amplification stage in this third embodiment of the invention. The stabilization circuit 28 is a part of the AC load of the drive stage 2, and a part of the input impedance of the transistor 1.

The stabilization circuit 28 includes a sub-stabilization circuit 28A and a parallel connected sub-stabilization circuit 28B. A resistance 32 and a capacitance 33 are connected in series in the sub-stabilization circuit 28A, and a resistance 29, a capacitance 30, and a switching transistor 31 are connected in series in the sub-stabilization circuit 28B. The sub-stabilization circuit 28A attenuates the drive stage output signal S2 and particularly the wireless frequency component of the transistor input signal S1A, and stabilizes amplification by the transistor 1 during normal operation when load variation can be ignored.

The comparator output voltage S6A is input to the gate of the switching transistor 31. When the comparator output voltage S6A is low, the switching transistor 31 is off and only the sub-stabilization circuit 28A of the stabilization circuit 28 operates. When the comparator output voltage S6A is high, the switching transistor 31 is on and both the sub-stabilization circuit 28A and the sub-stabilization circuit 28B of the stabilization circuit 28 operate. By rendering the stabilization circuit 28 with two sub-stabilization circuits 28A and 28B, sudden changes in the power gain and noise can be prevented when the stabilization circuit switches.

Therefore, when the gain change detection signal S5 becomes greater than the predetermined level, the sub-stabilization circuit 28B further attenuates the drive stage output signal S2 and particularly the wireless frequency component of the transistor input signal S1A. As a result, the sub-stabilization circuit 28B reduces the gain of the wireless frequency component of the drive stage 2. Furthermore, when the antenna impedance varies, the gain of the transistor 1 rises, the gain change detection signal S5 rises above the predetermined level, and the sub-stabilization circuit 28B operates. The sub-stabilization circuit 28B therefore reduces the power gain of the transistor 1, which rises in response to the impedance variation of the antenna, by lowering the amplitude level of the transistor input signal S1A. The gain of the drive stage 2 and the transistor 1 is thus reduced using the sub-stabilization circuit 28B, and amplification by the transistor 1 is further stabilized. As a result, the drive stage output signal S2 and the transistor input signal S1A can be controlled so that an overcurrent and overvoltage are avoided at the collector node 1B of the transistor 1. Operation of the wireless frequency power amplifier and a mobile device in which the wireless frequency power amplifier is used is therefore stabilized. This function is the same as reducing the base bias current S8 and S9 level in the first embodiment, and thus reliably achieves the same effect as the first embodiment.

The comparator 6A renders a control unit in this embodiment of the invention.

Note that the stabilization circuit 28 can be inserted between the drive stage 2 and the matching circuit 74. The operation and effect of this arrangement are the same as described in the third embodiment above.

An arrangement in which the stabilization circuit 28 is contained in the control unit, and the stabilization circuit 28 is not included in the final stage, is also possible. The actual operation and effect of this arrangement are the same as described in the third embodiment above.

Embodiment 4

A wireless frequency power amplifier according to a fourth embodiment of the invention is described next. Primarily the differences between this embodiment and the first embodiment are described below. Other aspects of the arrangement, operation, and effect of this embodiment are the same as in the first embodiment, and further description thereof is therefore omitted.

Figure 4:
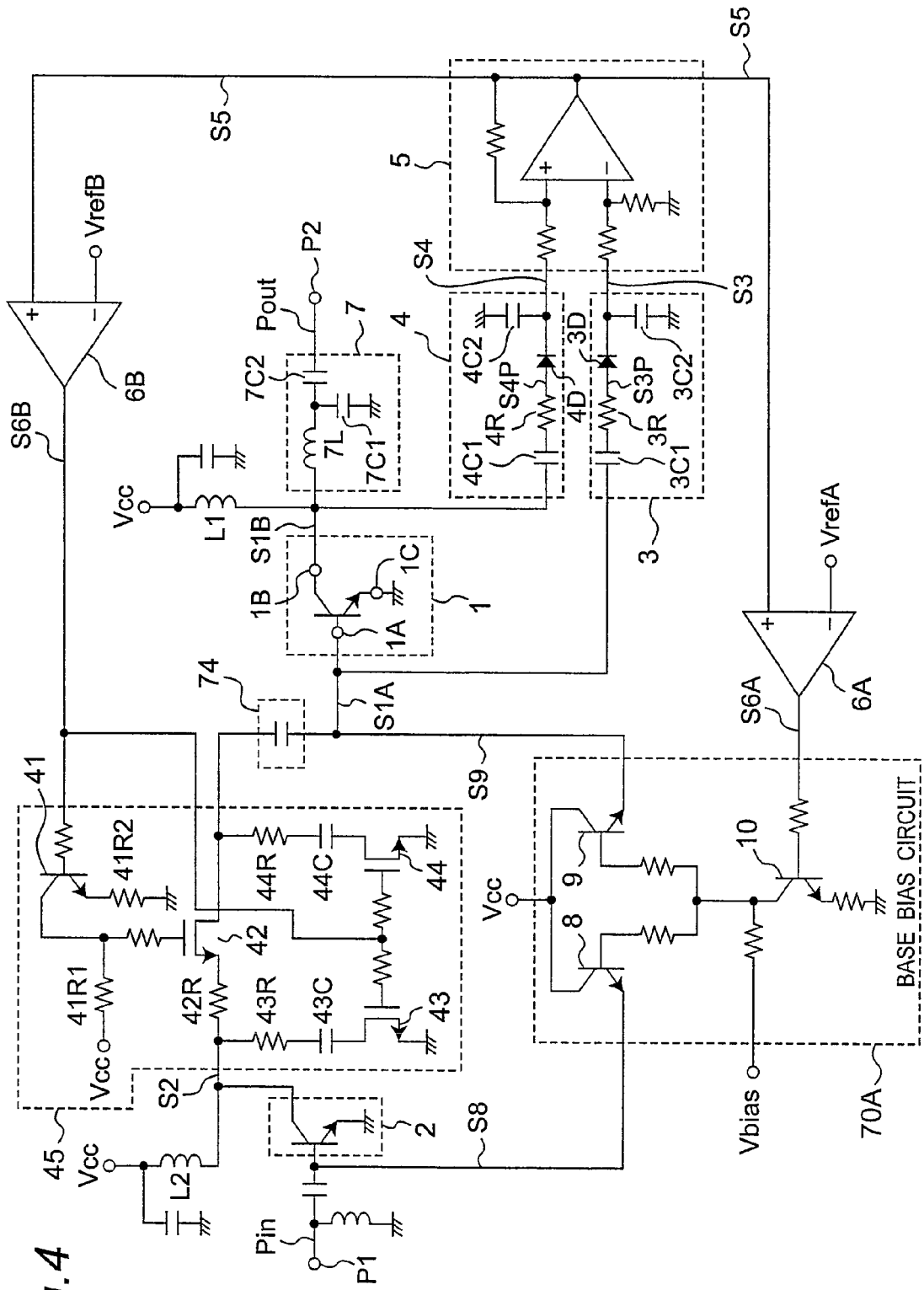
FIG. 4 is a circuit diagram showing the arrangement of a wireless frequency power amplifier according to a fourth embodiment of the invention.

FIG. 4 is an equivalent circuit diagram showing an example of a wireless frequency power amplifier according to a fourth embodiment of the invention. In the fourth embodiment as shown in FIG. 4, the wireless frequency power amplifier also has a variable attenuator 45 between the drive stage 2 and the matching circuit 74. The arrangement including the drive stage 2 and the variable attenuator 45 is also referred to as an amplification stage in this fourth embodiment of the invention. The variable attenuator 45 also forms part of the load of the drive stage 2.

The gain change detection signal S5 is input to the comparator 6A, and is also input to another comparator 6B. The comparator 6B compares the gain change detection signal S5 with a predetermined reference voltage VrefB, and outputs comparator output voltage S6B if the gain change detection signal S5 is greater than the reference voltage VrefB. More specifically, the comparator output voltage S6B goes from low to high. The comparator output voltage S6B is input to the variable attenuator 45. The comparator 6B is also referred to as a comparison unit.

In the variable attenuator 45, the comparator output voltage S6B is input to the base of transistor 41, and to the gate of transistors 43 and 44, the source of which is to ground. The emitter of transistor 41 goes to ground through resistance 41 R2, and the collector is connected to the Vcc power supply through resistance 41R1 and to the gate of transistor 42. The drain of the transistor 43 is connected to the output node of the drive stage 2 through a capacitance 43C and serially connected resistance 43R. The drain of transistor 44 is connected to the matching circuit 74 through a capacitance 44C and serially connected resistance 44R. The source of transistor 42 is connected to the output node of the drive stage 2 through resistance 42R, and the drain is connected to the matching circuit 74.

When the comparator output voltage S6B is low, transistors 41, 43, 44 are off and transistor 42 is on. This enables current to flow between the drive stage 2 and the matching circuit 74, and the operation is the same as in the first embodiment. When the comparator output voltage S6B is high, transistors 41, 43, 44 are on and transistor 42 is off.

The variable attenuator 45 in this arrangement is a pi-shaped circuit. A capacitance 43C and serially connected resistance 43R, and a capacitance 44C and serially connected resistance 44R, are parallel connected to the ends of a resistance 42R and serially connected transistor 42 with a high off resistance. Thus comprised, the variable attenuator 45 can attenuate the drive stage output signal S2 when the comparator output voltage S6B is high. As a result, the gain of the amplification stage including the drive stage 2 and the variable attenuator 45 is reduced, the transistor input signal S1A drops, the amplitude of the transistor output signal S1B drops, and the amplification operation of the transistor 1 is stabilized.

If the load fluctuation is relatively small, not exceeding a voltage standing wave ratio (VSWR) of 3:1, the variable attenuator 45 operates linearly and has the advantage of decreasing the distortion component in the amplifier output signal Pout compared with the base bias circuit 70A. The variable attenuator 45 is therefore driven when the reference voltage VrefB is lower than reference voltage VrefA and the load variation is small, and both the variable attenuator 45 and the base bias circuit 70A operate when the load fluctuation then rises.

More specifically, if the gain change detection signal S5 rises above the predetermined reference voltage VrefB, the gain of the drive stage 2 is lowered using the variable attenuator 45. This controls the drive stage output signal S2 and the transistor input signal S1A, and enables preventing distortion of the transistor input signal S1A. Leakage of distortion components to an adjacent channel when modulation precision deteriorates due to variation in the load impedance and the distortion component of the signal waveform increases can therefore be prevented. Furthermore, when the gain change detection signal S5 rises above reference voltage VrefA, the level of the base bias currents S8 and S9 is reduced to below a predetermined level using the base bias circuit 70A. This enables controlling the drive stage output signal S2 and the transistor input signal S1A, and avoids an overcurrent and overvoltage at the collector node 1B of the transistor 1. Operation of the wireless frequency power amplifier and a mobile device in which the wireless frequency power amplifier is used is therefore stabilized. This function is the same as reducing the base bias current S8 and S9 level in the first embodiment, and thus reliably achieves the same effect as the first embodiment.

The comparator 6A, base bias circuit 70A, and comparator 6B render a control unit in this embodiment of the invention.

Embodiment 5

A wireless frequency power amplifier according to a fifth embodiment of the invention is described next. Primarily the differences between this embodiment and the first embodiment are described below. Other aspects of the arrangement, operation, and effect of this embodiment are the same as in the first embodiment, and further description thereof is therefore omitted.

Figure 5:
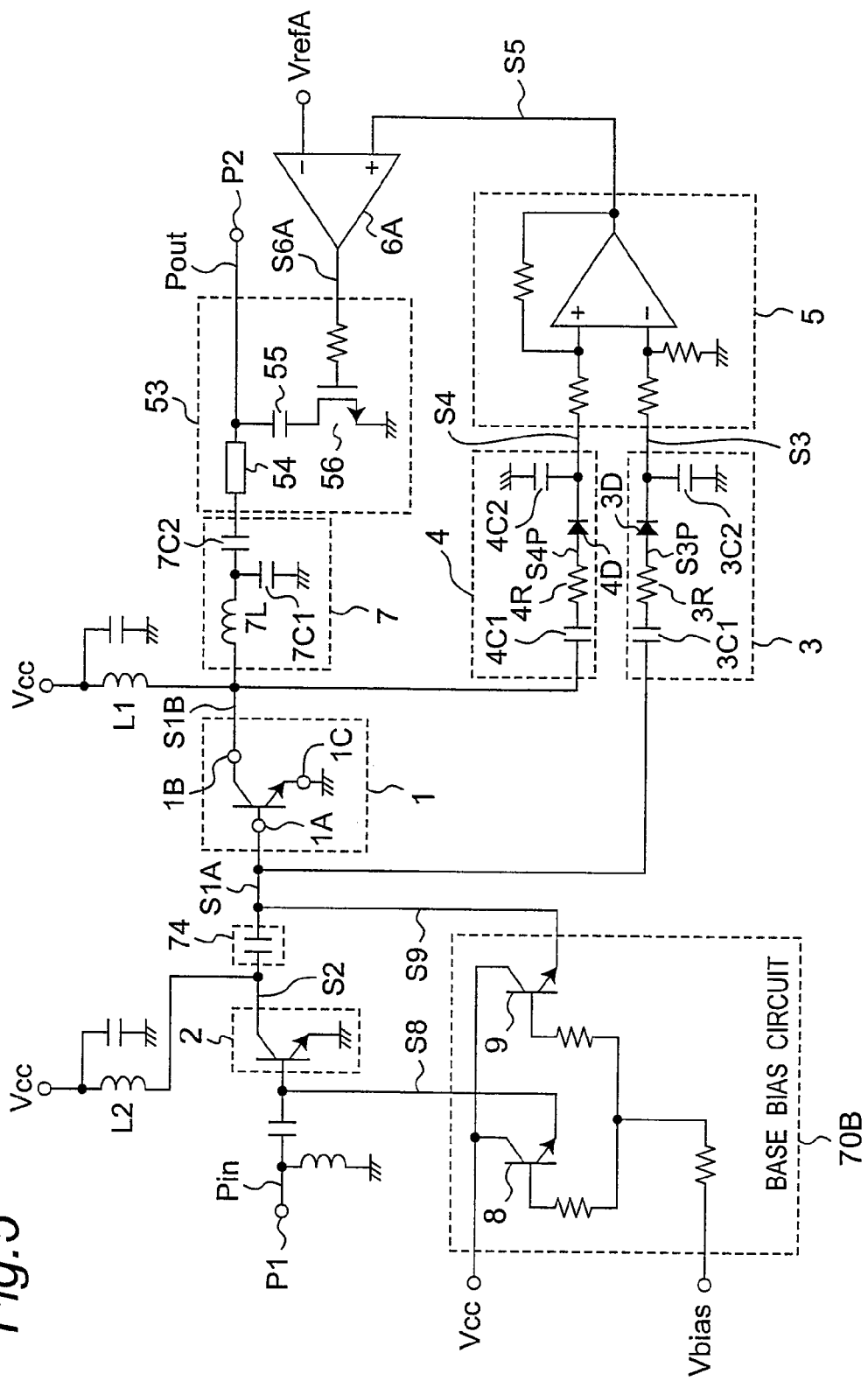
FIG. 5 is a circuit diagram showing the arrangement of a wireless frequency power amplifier according to a fifth embodiment of the invention.

FIG. 5 is an equivalent circuit diagram showing an example of a wireless frequency power amplifier according to a fifth embodiment of the invention. In the fifth embodiment as shown in FIG. 5, the base bias circuit 70B outputs predetermined base bias currents S8 and S9 based on a predetermined voltage Vbias without being controlled by the comparator output voltage S6A.

In addition, the wireless frequency power amplifier includes an impedance conversion circuit 53 between the matching circuit 7 and the amplifier output node P2. The impedance conversion circuit 53 is also referred to as an impedance setting unit. The arrangement including the matching circuit 7 and the impedance conversion circuit 53 is also referred to as a matching unit.

The impedance conversion circuit 53 includes a transmission path 54, a capacitance 55, and a switching transistor 56. The switching transistor 56 can be rendered with a switching unit other than a transistor, and is therefore also referred to as a switching device. The transmission path 54 has a substantially 50-Ω rated impedance, and is inserted in series between the matching circuit 7 and the amplifier output node P2. The capacitance 55 and the switching transistor 56 are connected in series between the amplifier output node P2 and ground.

The comparator output voltage S6A is input to the gate of the switching transistor 56. When the comparator output voltage S6A is low, the switching transistor 56 is off and operation is the same as in the first embodiment when the comparator output voltage S6A is low. When the comparator output voltage S6B goes high, the switching transistor 56 turns on and the impedance conversion circuit 53 is enabled. The transfer characteristic of the matching unit including the matching circuit 7 and impedance conversion circuit 53 changes in this case. More specifically, the impedance conversion circuit 53 attenuates the wireless frequency component of the amplifier output signal Pout, and can effectively compensate for the load impedance fluctuation. The transfer characteristic of the matching unit changing is also referred to as the gain of the matching unit changing.

Because the antenna connected to the amplifier output node P2 and the matching unit form part of the transistor 1 load, the gain of the transistor 1 may increase when the antenna impedance changes. As a result, the gain change detection signal S5 rises above a predetermined level, the switching transistor 56 turns on, and the impedance conversion circuit 53 absorbs and removes the effect of fluctuating antenna impedance by the capacitance 55 connected parallel to the antenna. As a result, by absorbing and removing the fluctuating antenna impedance, the impedance conversion circuit 53 reduces the power gain of the transistor 1, which tends to rise when the antenna impedance fluctuates.

As described above, when the gain change detection signal S5 rises above a predetermined level, the transistor 1 is stabilized using the impedance conversion circuit 53. This enables controlling the transistor output signal S1B and the amplifier output signal Pout and avoiding an overcurrent and overvoltage at the collector node 1B of the transistor 1. This function is the same as reducing the base bias current S8 and S9 level in the first embodiment, and thus reliably achieves the same effect as the first embodiment. In addition, the amplifier output signal Pout can be prevented from being distorted because the impedance conversion circuit 53 operates in the linear range. Leakage of distortion components to an adjacent channel when modulation precision deteriorates due to variation in the load impedance and the distortion component of the signal waveform increases can therefore be prevented. Operation of the wireless frequency power amplifier and a mobile device in which the wireless frequency power amplifier is used is therefore stabilized.

The comparator 6A functions as a control unit in this embodiment of the invention. The impedance conversion circuit 53 can be included in the control unit. The actual operation and effect of this arrangement is the same as in the fifth embodiment described above.

Embodiment 6

A wireless frequency power amplifier according to a sixth embodiment of the invention is described next. Primarily the differences between this embodiment and the first embodiment are described below. Other aspects of the arrangement, operation, and effect of this embodiment are the same as in the first embodiment, and further description thereof is therefore omitted.

Figure 6:
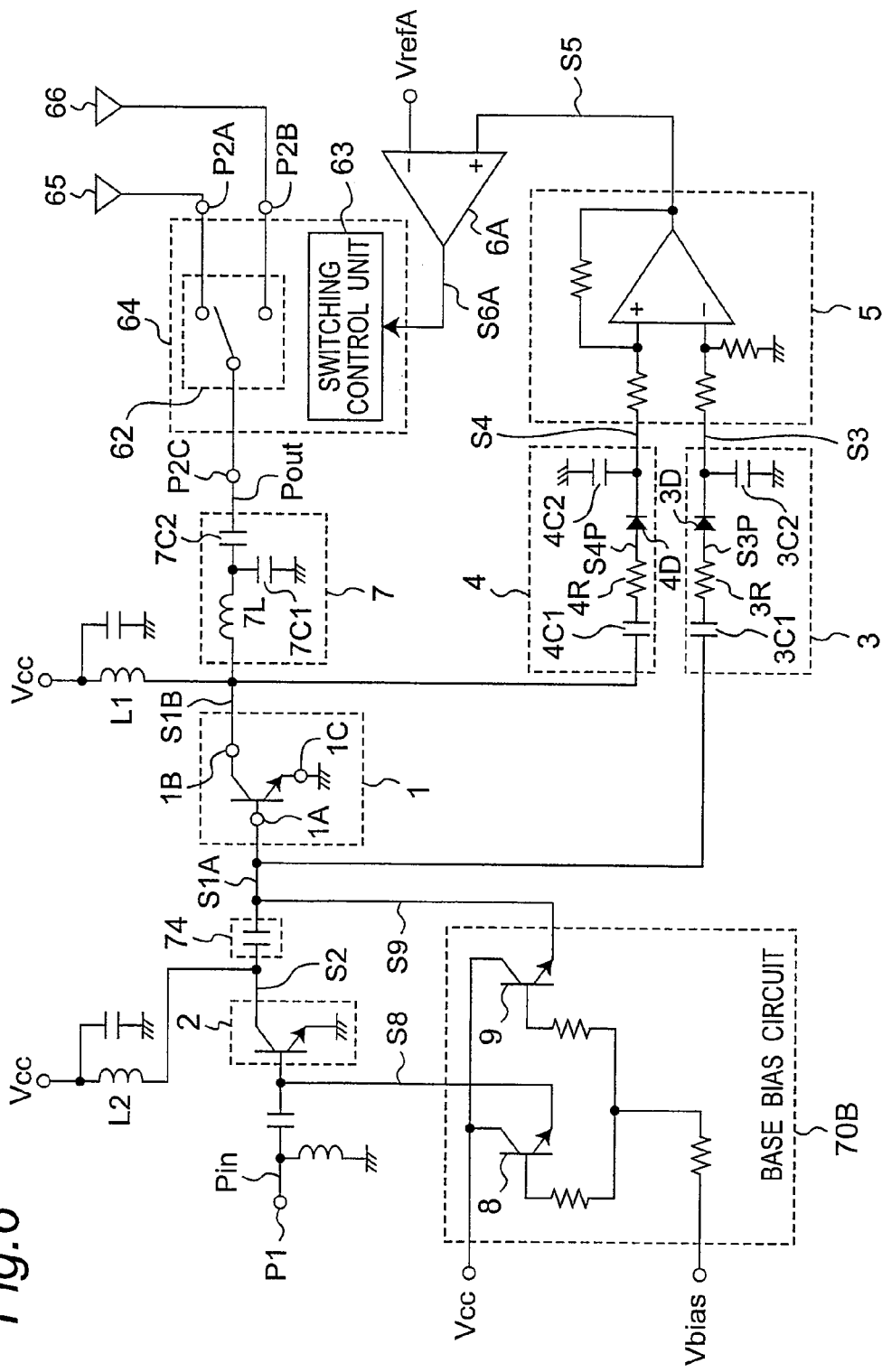
FIG. 6 is a circuit diagram showing the arrangement of a wireless frequency power amplifier according to a sixth embodiment of the invention.

FIG. 6 is an equivalent circuit diagram showing an example of a wireless frequency power amplifier according to a sixth embodiment of the invention. In the sixth embodiment as shown in FIG. 6, the base bias circuit 70B outputs predetermined base bias currents S8 and S9 based on a predetermined voltage Vbias without being controlled by the comparator output voltage S6A.

In addition, the wireless frequency power amplifier also includes the output node P2C of the matching circuit 7, the amplifier output node P2A, and the amplifier output node P2B. The amplifier output node P2A is connected to an antenna 65, and the amplifier output node P2B is connected to another antenna 66. The wireless frequency power amplifier also includes a wireless frequency switch 64 between output node P2A, output node P2B, and output node P2C. The wireless frequency switch 64 is also referred to as a switching unit. The section including the matching circuit 7 and the wireless frequency switch 64 is also referred to as a matching unit.

The wireless frequency switch 64 includes a switch 62 and a switching control unit 63. The switching control unit 63 determines whether the amplifier output signal Pout is output from antenna 65 or from antenna 66 based on the comparator output voltage S6A.

When the comparator output voltage S6A is low, the switching control unit 63 holds the current connection state, and when the comparator output voltage S6A goes high switches to a connection state other than the current connection. That is, the wireless frequency switch 64 controls the amplifier output signal Pout based on the comparator output voltage S6A, and selects the path whereby the amplifier output signal Pout is output to the antennas 65 and 66. When the path is open between the output node P2C and amplifier output node P2A, the amplifier output signal Pout is output to amplifier output node P2A. Conversely, when the switch connects the output node P2C to amplifier output node P2B, the amplifier output signal Pout is output from amplifier output node P2B.

The comparator output voltage S6A goes high when the antenna is near an obstruction and the load impedance fluctuates. By switching to a different antenna with a better termination state in this case, the amplifier output signal Pout can be transmitted and a mobile device with high signal transmission quality can be achieved. In addition, because the load impedance fluctuates when the antenna is broken, a good antenna can be automatically selected and the amplifier output signal Pout can be transmitted. A high reliability mobile device can also be provided.

Switching the wireless frequency switch 64 causes the transfer characteristic of the matching unit including the matching circuit 7 and wireless frequency switch 64 switch at either the amplifier output node P2A or amplifier output node P2B between the normal transfer characteristic and the transfer characteristic when signal transmission is blocked. Changing the transfer characteristic of the matching unit is also referred to as a changing the gain of the matching unit herein.

Because the antennas 65 and 66 and the matching unit form part of the load of the transistor 1, the gain of the transistor 1 may increase if the antenna impedance changes. As a result, the gain change detection signal S5 rises above a predetermined level, the wireless frequency switch 64 switches, and the wireless frequency switch 64 isolates the effect of the impedance variation of the antenna 65 or 66 by thus switching. By thus isolating the impedance fluctuation of the antenna, the wireless frequency switch 64 reduces the power gain of the transistor 1, which tends to rise when the antenna impedance fluctuates.

The transistor 1 is therefore stabilized using the wireless frequency switch 64 if the gain change detection signal S5 rises above a predetermined level. This controls the amplifier output signal Pout and avoids an overcurrent and overvoltage at the collector 1B of the transistor 1. Operation of the wireless frequency power amplifier and a mobile device in which the wireless frequency power amplifier is used is also stabilized.

The comparator 6A functions as a control unit in this embodiment of the invention. The wireless frequency switch 64 can also be included in the control unit. The actual operation and effect of this arrangement is the same as in the sixth embodiment described above.

Performance Curves and Waveform Diagrams

Figure 7:
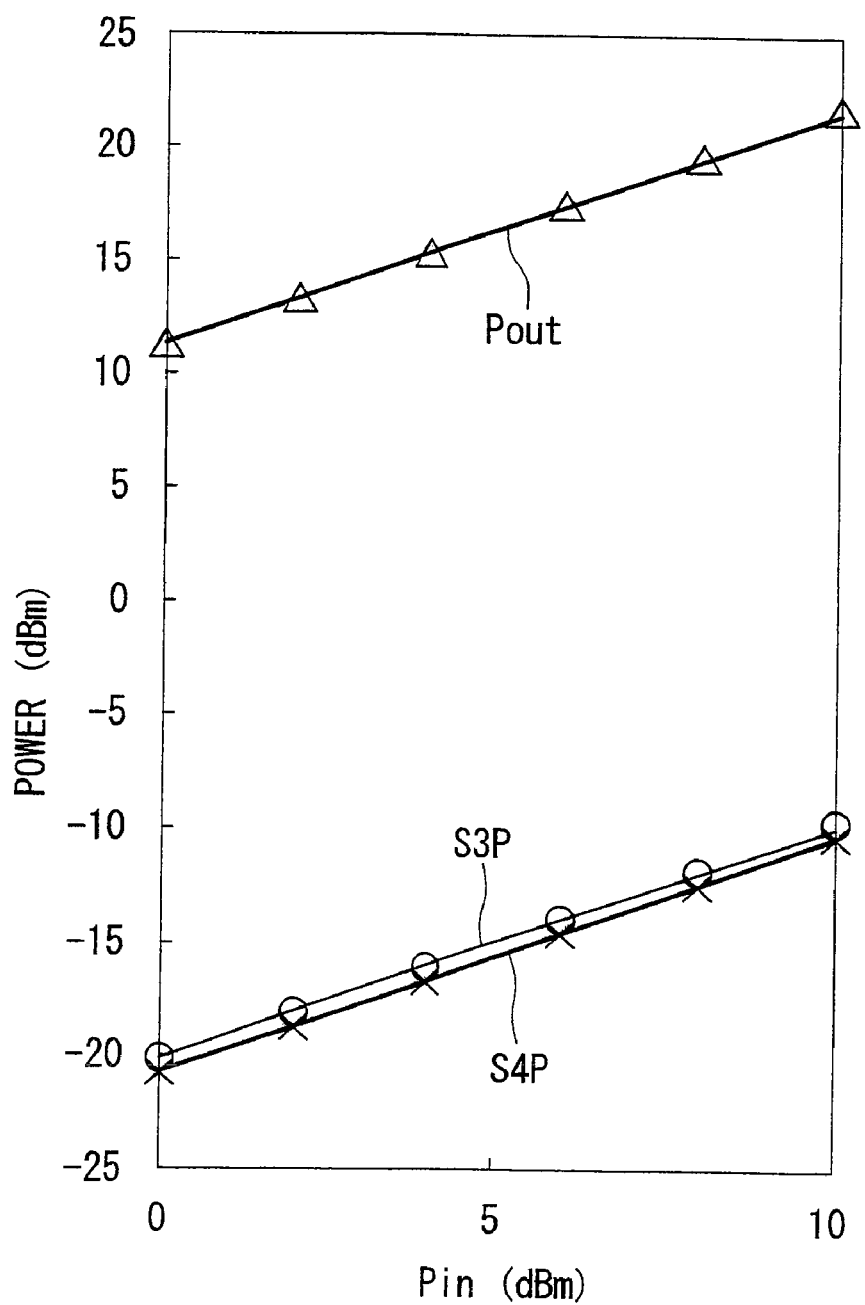
FIG. 7 is a graph showing the input/output characteristics of the wireless frequency power amplifiers according to the embodiments of the invention.

FIG. 7 shows the results of simulations conducted using equivalent circuits for the first to sixth embodiments described above, and shows the input/output characteristic of the wireless frequency power amplifier. In FIG. 7 the amplifier output signal Pout increases proportionally to the amplifier input signal Terminal, and the detected power S3P and S4P also rises. In addition, detected power S3P and detected power S4P are substantially equal for the same amplifier input signal Terminal. As a result, the difference between detected power S3P and detected power S4P is substantially zero for modulation signals resulting from different amplifier input signals Terminal.

Figure 8A:
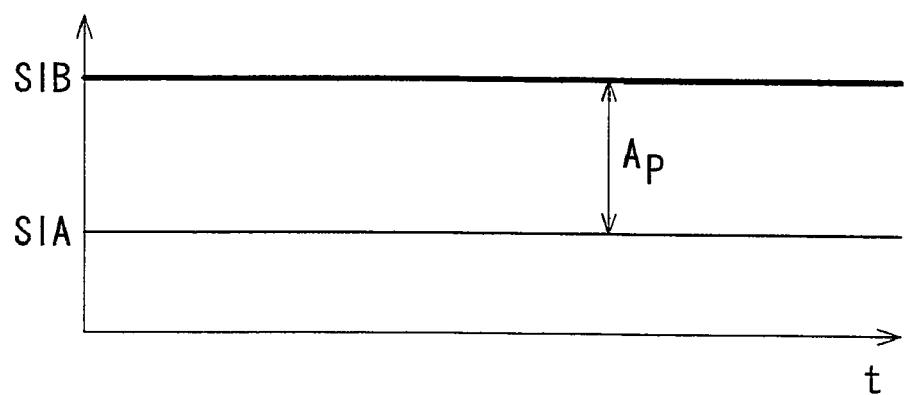
FIG. 8A is a waveform diagram describing the operation of certain components in the embodiments of the invention.
Figure 8B:
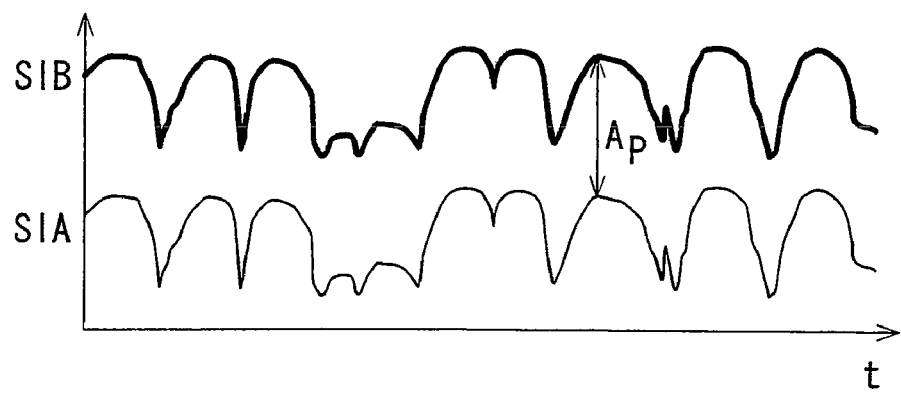
FIG. 8B is a waveform diagram describing the operation of certain components in the embodiments of the invention.
Figure 8C:
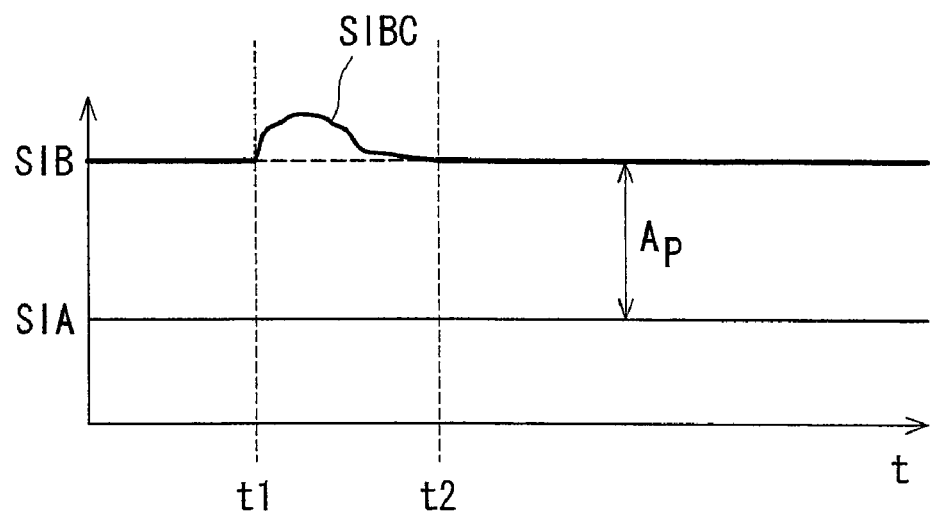
FIG. 8C is a waveform diagram describing the operation of certain components in the embodiments of the invention.
Figure 8D:
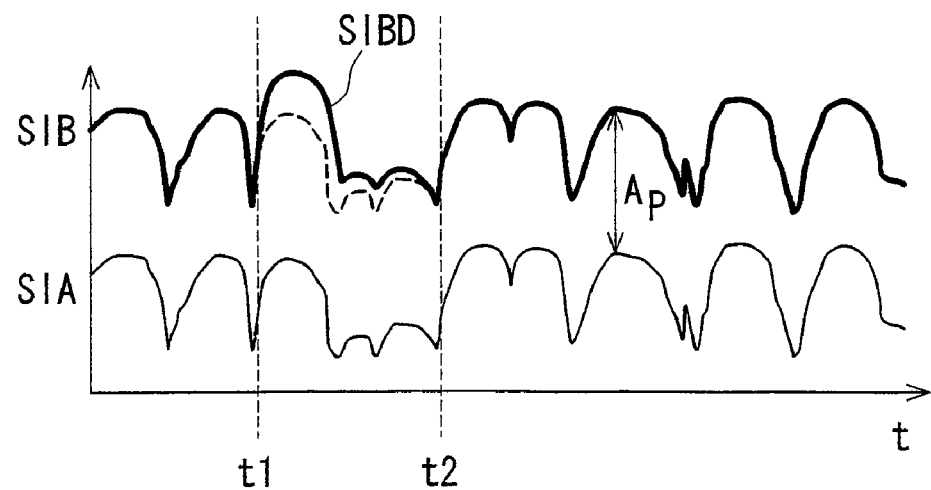
FIG. 8D is a waveform diagram describing the operation of certain components in the embodiments of the invention.
Figure 8E:
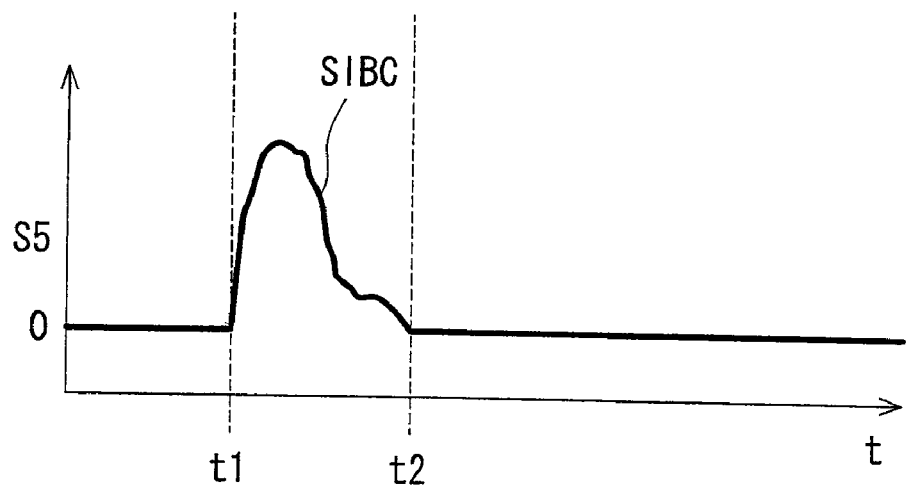
FIG. 8E is a waveform diagram describing the operation of certain components in the embodiments of the invention.
Figure 8F:
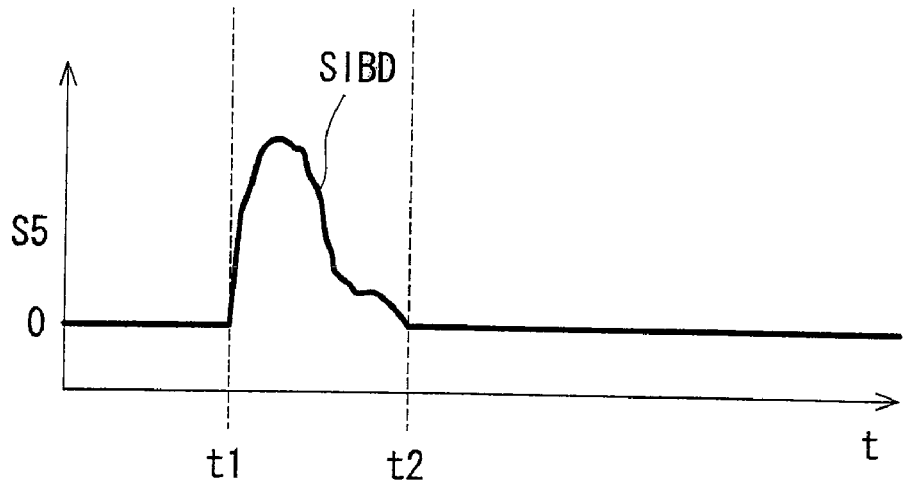
FIG. 8F is a waveform diagram describing the operation of certain components in the embodiments of the invention.

FIG. 8A, FIG. 8B, FIG. 8C, FIG. 8D, FIG. 8E, and FIG. 8F are waveform diagrams describing the operation of the first to sixth embodiments. The x-axis shows time t. The y-axis shows power expressed in decibels in FIG. 8A to FIG. 8D, and shows voltage on a linear scale in FIG. 8E and FIG. 8F. FIG. 8A, FIG. 8C, and FIG. 8E show the waveforms that resulted when a GSM (Global System for Mobile Communications) signal was used as the amplifier input signal Terminal, and FIG. 8B, FIG. 8D, and FIG. 8F show the results when a CDMA was used. A GSM signal is typical of a modulation signal with no amplitude variation, and the CDMA signal is typical of a modulation signal with variable amplitude.

The results shown in FIG. 8A and FIG. 8B were obtained with the amplifier output node P2 terminated at 50Ω and no variation in the load impedance. In both FIG. 8A and FIG. 8B, therefore, the transistor output signal S1B is a waveform that is greater than the transistor input signal S1A by the power gain Ap of the transistor 1.

The results shown in FIG. 8C and FIG. 8D were obtained with the amplifier output node P2 connected to the antenna and variable load impedance induced from time t1 to time t2 by setting the antenna close to a metal shield. Load fluctuation S1BC and S1BD appeared only in the transistor output signal S1B from time t1 to t2 in this case, and did not appear at the transistor input signal S1A. Furthermore, while the load variation S1BC was detectable from the transistor output signal S1B in the case of the GSM signal (FIG. 8C), the amplitude variation of the modulation signal and load variation S1BD are contained in the transistor output signal S1B in the case of a CDMA signal (FIG. 8D), and detecting load variation S1BD alone is not possible.

FIG. 8E and FIG. 8F show the waveform of the gain change detection signal S5 using a GSM signal and CDMA signal, respectively. In FIG. 8C and FIG. 8D, the transistor output signal S1B drops equally to the power gain Ap of the transistor 1 due to the detection circuits 3 and 4 compared with the transistor input signal S1A, are transistor output signal S1B and transistor input signal S1A are therefore substantially equal except from time t1 to t2. As a result, the gain change detection signal S5 goes substantially to zero except from time t1 to t2 as shown in FIG. 8E and FIG. 8F, and load variations S1BC and S1BD is detectable from time t1 to t2. As a result, the load variation S1BC, S1BD can be accurately detected for both a GSM signal and CDMA signal by a differential amplifier circuit 5 and detection circuits 3 and 4 having a gain difference equal to power gain Ap.

Embodiment 7

A wireless frequency power amplifier according to a seventh embodiment of the invention is described next. Primarily the differences between this embodiment and the first embodiment are described below. Other aspects of the arrangement, operation, and effect of this embodiment are the same as in the first embodiment, and further description thereof is therefore omitted.

The section including the detection circuit 3, the detection circuit 4, and the differential amplifier circuit 5 are referred to as the gain change detection unit 80 in this embodiment. Similarly to the first embodiment, the wireless frequency power amplifier according to this seventh embodiment includes a gain change detection unit 80.

Figure 9:
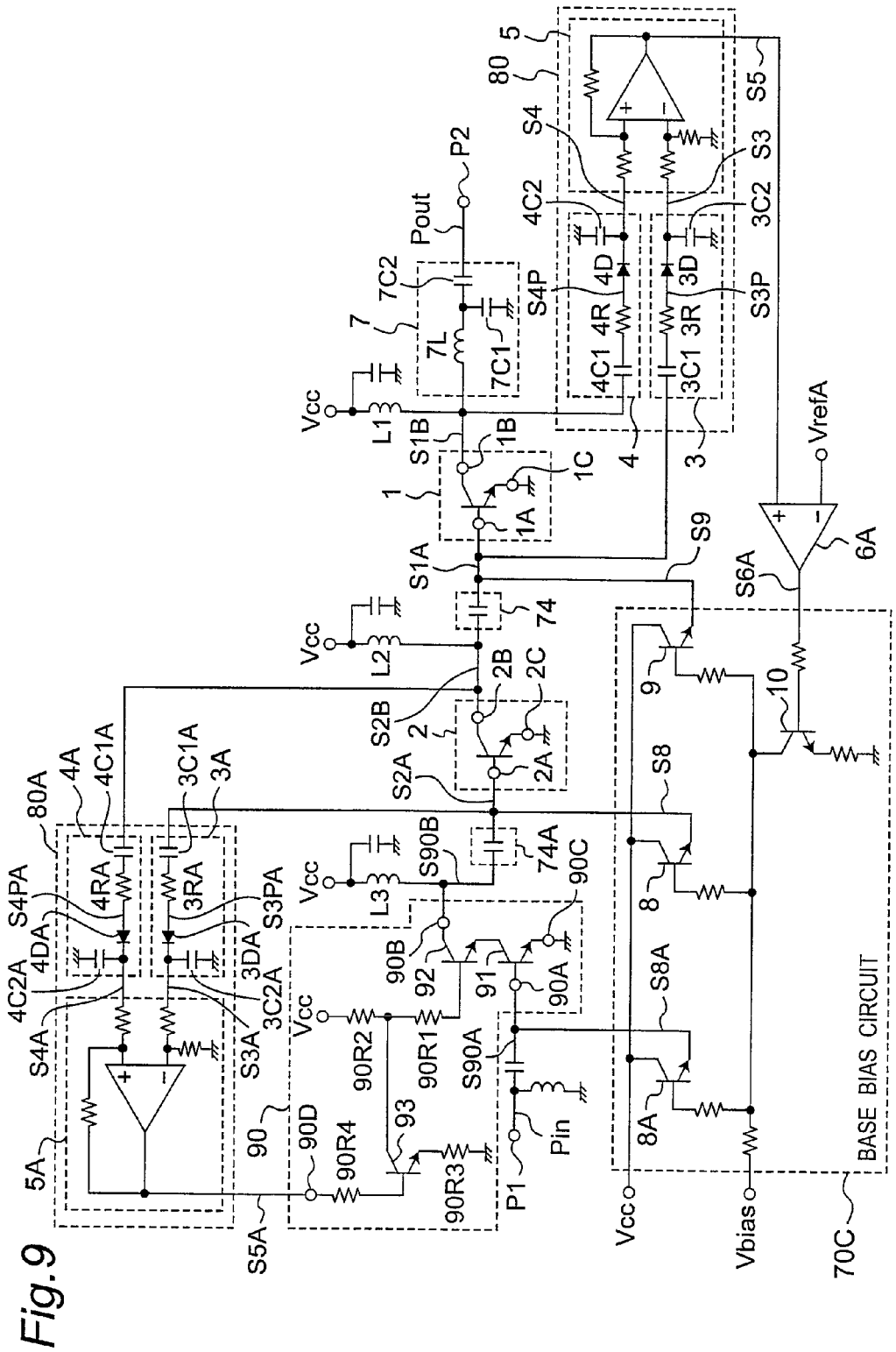
FIG. 9 is a circuit diagram showing the arrangement of a wireless frequency power amplifier according to a seventh embodiment of the invention.

FIG. 9 is an equivalent circuit diagram showing an example of a wireless frequency power amplifier according to a seventh embodiment of the invention. In the seventh embodiment as shown in FIG. 9, there are three main differences between the wireless frequency power amplifier according to this seventh embodiment and the first embodiment. First, an adjustment stage 90 and a matching circuit 74A are inserted between the amplifier input node P1 and drive stage 2 in this embodiment. Second, the base bias circuit 70A is changed to a base bias circuit 70C. Third, a gain change detection unit 80A identical to gain change detection unit 80 is provided.

The adjustment stage 90 includes transistors 91, 92, 93, and resistances 90R1, 90R2, 90R3, 90R4. The amplifier input signal Terminal is output by the matching circuit including an inductance and capacitance as adjustment stage input signal S90A, and input to the base 90A of the transistor 91. The emitter 90C of the transistor 91 is grounded, and the collector of the transistor 91 is connected to the emitter of the transistor 92. The emitter of transistor 91 goes to ground, the base of transistor 92 goes to ground, and the circuit including transistors 91 and 92 is thus a cascode circuit. The adjustment stage input signal S90A is amplified to adjustment stage output signal S90B by this cascode circuit, and output form the collector 90B of the transistor 92. The adjustment stage 90 is also called amplifier stage adjustment stage 90, and the adjustment stage input signal S90A and adjustment stage output signal S90B are also called modulation signals. The input node 90A is also called the input terminal, the collector node 90B is also called the output terminal, and the emitter 90C is also called the common node.

The adjustment stage output signal S90B is output from the matching circuit 74A as drive stage input signal S2A, and input to the input node 2A of a transistor in the drive stage 2. Like the matching circuit 74, the matching circuit 74A is composed of a single capacitance, matches the input/output impedance, and converts the adjustment stage output signal S90B to drive stage input signal S2A. The matching circuit 74A also functions as a coupling capacitor. The drive stage input signal S2A is amplified to drive stage output signal S2B by a transistor in the drive stage 2, which goes to ground through the emitter 2C, and output from the collector 2B. The drive stage output signal S2B is the same as the drive stage output signal S2 in the first embodiment. The drive stage input signal S2A and the drive stage output signal S2B are both also called modulation signals. The base 2A is also the input node, the collector 2B is also called the output node, and the emitter 2C is also called the common node.

The base bias circuit 70C is the base bias circuit 70A of the first embodiment with a transistor 8A added parallel to transistors 8 and 9.

The comparator output voltage S6A is input to the base bias circuit 70C. In the base bias circuit 70C, the comparator output voltage S6A is input to the base of transistor 10, and the collector output of the transistor 10 is input to the base of each of transistors 8A, 8, and 9. A voltage Vbias that is lower than the supply voltage Vcc is also simultaneously supplied from the Vbias supply to the base of each of transistors 8A, 8, and 9. The supply voltage Vcc from the Vcc supply is supplied to the collector of the transistors 8A, 8, and 9, and base bias current S8A, S8, S9 is output respectively from the emitters of transistors 8A, 8, and 9. Base bias current S8A, S8, and S9 are input respectively to the input node 90A of the adjustment stage 90, the input node 2A of the drive stage 2, and the input node 1A of the final stage 1, thereby supply the dc current required for operation. The base bias current S8A, S8, and S9 are also referred to as bias signals.

In the base bias circuit 70C, when the comparator output voltage S6A goes low, the base of transistors 8A, 8, and 9 is set to the predetermined voltage Vbias and become active, and base bias current S8A, S8, and S9 is sufficiently supplied to the adjustment stage 90, drive stage 2, and final stage 1, respectively. If the comparator output voltage S6A goes high, transistor 10 turns on, the base voltage of transistors 8A, 8, and 9 goes low, and base bias current S8A, S8, and S9 are digitally cut off.

With the same operation as described in the first embodiment, the gain change detection unit 80 detects the change in the power gain of the final stage 1 based on the final stage input signal S1A and the final stage output signal S1B, and generates the gain change detection signal S5. As a result, the effect of amplitude variation in the modulation signal does not appear in the gain change detection signal S5, and only the effect of load fluctuation appears. If the load fluctuation is sufficiently great, the base bias current S8A, S8, and S9 are cut off or reduced.

When base bias current S8A is cut off or reduced, the signal amplitude of the adjustment stage output signal S1B decreases and the signal amplitude of the drive stage input signal S2A decreases. When base bias current S8 is cut off or reduced, the dc component of the drive stage input signal S2A decreases. Therefore, if the base bias currents S8A and S8 are cut off or reduced, the signal amplitude and dc component of the drive stage input signal S2A are reduced, and as a result the signal amplitude of the drive stage output signal S2B drops and the signal amplitude of the final stage input signal S1A drops.

If base bias current S9 is cut off or reduced, the dc component of the transistor input signal S1A decreases. Thus, if base bias current S8A, S8, and S9 are cut off or reduced (that is, reduced to below a predetermined level), the signal amplitude and dc component of the final stage input signal S1A decrease, and as a result the signal amplitude of the final stage output signal S1B drops. More specifically, the gain of the adjustment stage 90, drive stage 2, and final stage 1 drops, and the amplification operation of the final stage 1 is stabilized.

As described above, when a wireless frequency power amplifier amplifies a CDMA or similar modulation signal containing amplitude variation, and the load impedance varies because the antenna is near an obstruction, both amplitude variation and load variation appear at the output node 1B of the final stage 1. In this case, only load variation is detected in the gain change detection signal S5 generated by the gain change detection unit 80.

Therefore, when the gain change detection signal S5 rises above a predetermined level, the base bias circuit 70C is used to lower the base bias currents S8 and S9 to a predetermined level or below. This enables controlling the final stage input signal S1A and avoids applying an overcurrent or overvoltage to the output node 1B of the final stage 1.

The wireless frequency power amplifier is thus protected from damage due to load fluctuation, and reliability is improved. Mobile devices in which the wireless frequency power amplifier is used can also be protected from heat damage caused by load fluctuations. In addition, the operation of the wireless frequency power amplifier and mobile devices using the wireless frequency power amplifier is stabilized. The size and weight of the mobile device can also be reduced because there is no need to use an isolator. Yet further, because there is no loss from insertion of an isolator, the power consumption of the wireless frequency power amplifier is reduced and the air time of the cell phone using the wireless frequency power amplifier can be increased.

The operation and effect of the first to sixth embodiments was described above with reference to FIG. 7 and FIG. 8A to FIG. 8F. The same description applies to this seventh embodiment, and further description thereof is thus omitted.

The section including the gain change detection unit 80A and the adjustment stage 90 is described next. The gain change detection unit 80A includes a detection circuit 3A, a detection circuit 4A, and a differential amplifier circuit 5A. The arrangement of the gain change detection unit 80A is identical to the gain change detection unit 80, and detailed description thereof is thus omitted. However, the gain change detection unit 80A is connected differently from the gain change detection unit 80, and the optimum conditions for detecting a gain change therefore also differ at times. The values of the components contained in the gain change detection unit 80A may therefore differ from the values of the components contained in the gain change detection unit 80.

The drive stage input signal S2A and the drive stage output signal S2B are respectively input to the input node 2A of the drive stage 2 and from the output node 2B to the gain change detection unit 80A, and the gain change detection signal S5A is output from the output node of the gain change detection unit 80A. The differential amplifier circuit 5A is also referred to as a difference unit.

Note that the gain change detection unit 80A can generate the gain change detection signal based on the transistor input signal S1A instead of the drive stage output signal S2B. The gain change detection unit can also generate the gain change detection signal based on the adjustment stage output signal S90B instead of using the drive stage input signal S2A.

The output node of the gain change detection unit 80A is connected to the control node 90D of the adjustment stage 90, and the control node 90D is connected through the resistance 90R4 to the base of the transistor 93. The emitter of transistor 93 goes to ground through resistance 90R3, and the collector of transistor 93 is connected to the Vcc power supply through resistance 90R2. The node between the collector of transistor 93 and resistance 90R2 is connected to the base of transistor 92 through resistance 90R1.

The gain change detection unit 80A detects change in the power gain of the drive stage 2 based on the drive stage input signal S2A and the drive stage output signal S2B, and generates the gain change detection signal S5A. If the gain of the drive stage 2 rises, the voltage level of the gain change detection signal S5A rises and the collector current of the transistor 93 rises, causing the voltage at the node between the collector of transistor 93 and resistance 90R2 to drop. The collector current of the transistor 92 therefore drops and the adjustment stage output signal S90B level rises. More specifically, the power gain of the adjustment stage 90 decreases.

However, when the power gain of the drive stage 2 drops, the voltage level of the gain change detection signal S5A drops, the collector current of the transistor 93 drops, and the voltage at the node between the collector of the transistor 93 and resistance 90R2 rises. The collector current of transistor 92 therefore rises and the adjustment stage output signal S90B level rises. More specifically, the power gain of the adjustment stage 90 increases.

The power gain of the adjustment stage 90 therefore decreases linearly as the gain change detection signal S5A rises as a result of using the gain change detection unit 80A, and cancels the change in the power gain of the drive stage 2.

Figure 11A:
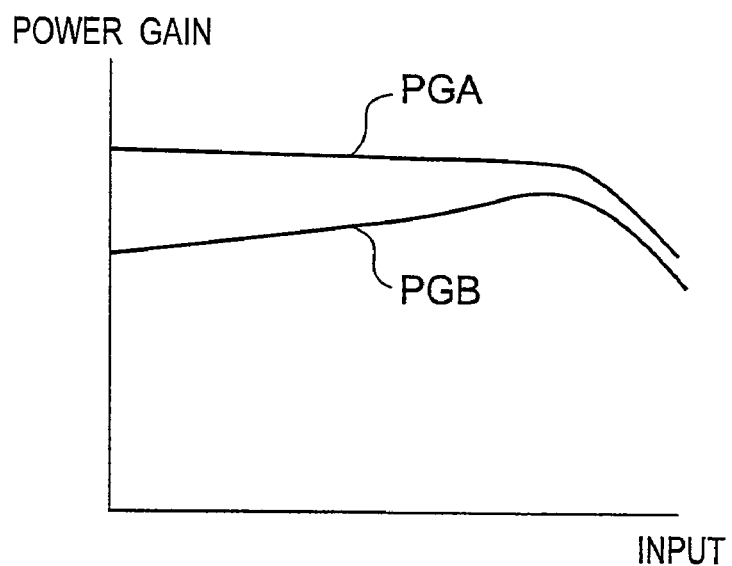
FIG. 11A is a waveform diagram describing the operation of a wireless frequency power amplifier according to the seventh embodiment of the invention.
Figure 11B:
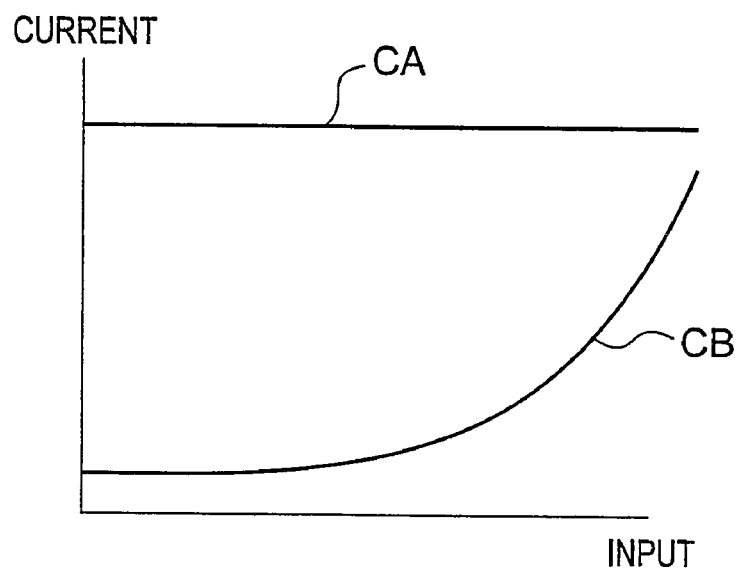
FIG. 11B is a waveform diagram describing the operation of a wireless frequency power amplifier according to the seventh embodiment of the invention.

The transistor of the drive stage 2 operates as a class B device. If a class A arrangement is used, the operating current of the transistor would be substantially constant irrespective of the input signal level as shown by curve CA in FIG. 11B. If a class B arrangement is used, however, the operating current of the transistor is sufficiently lower and current consumption is reduced compared with the class A operation when the input signal level is low as shown by curve CB in FIG. 11B. However, the operating current then rises sharply as the input signal level rises. As a result, the power gain of the transistor is substantially constant irrespective of the input signal level when class A operation is used as shown by curve PGA in FIG. 11A. With class B operation, however, the power gain of the transistor increases gradually as the input signal input signal level rises as indicated by curve PGB in FIG. 11A. The power gain of the drive stage 2 operating in a class B mode therefore changes according to the input signal level.

Figure 11C:
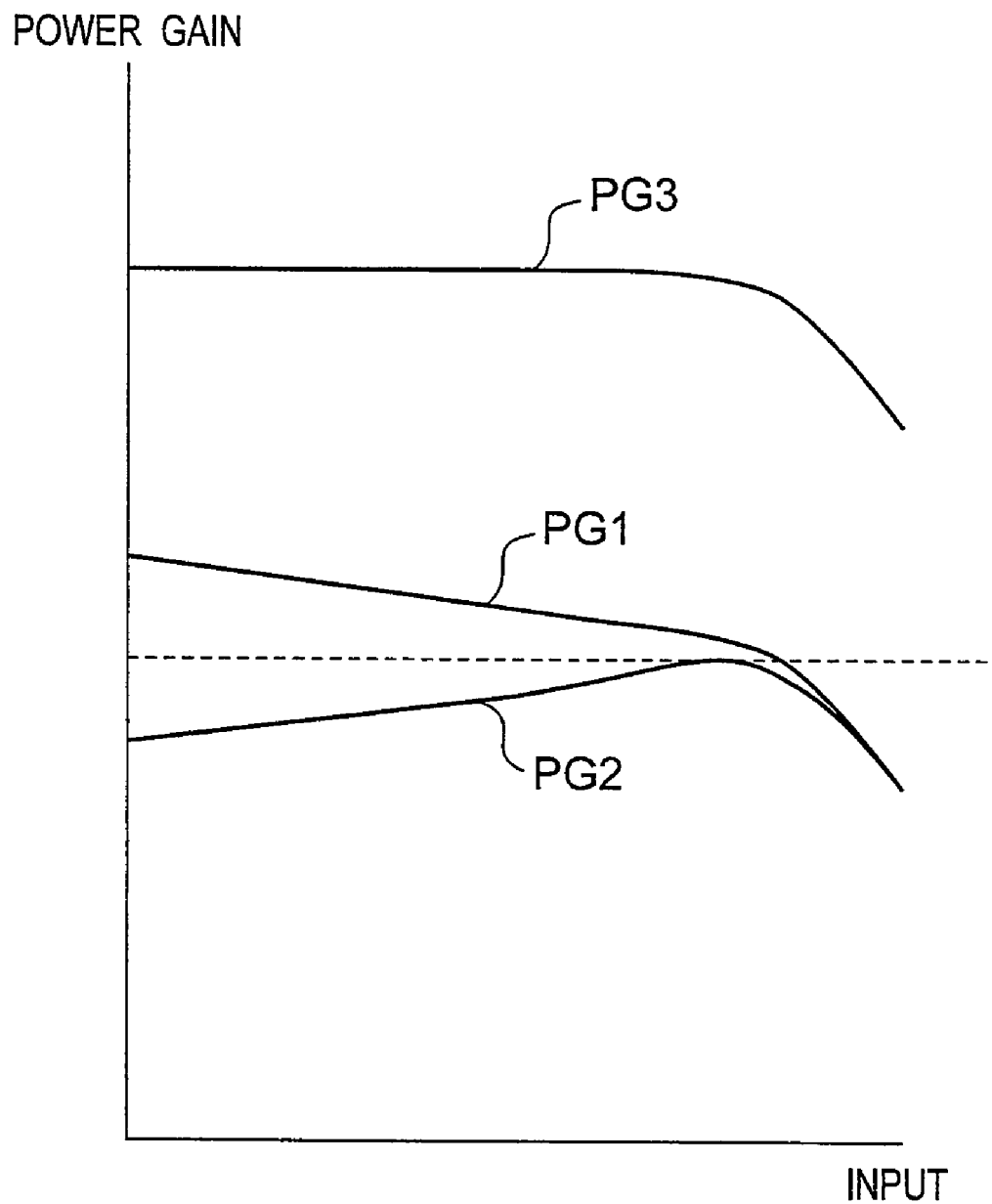
FIG. 11C is a waveform diagram describing the operation of a wireless frequency power amplifier according to the seventh embodiment of the invention.
Figure 12:
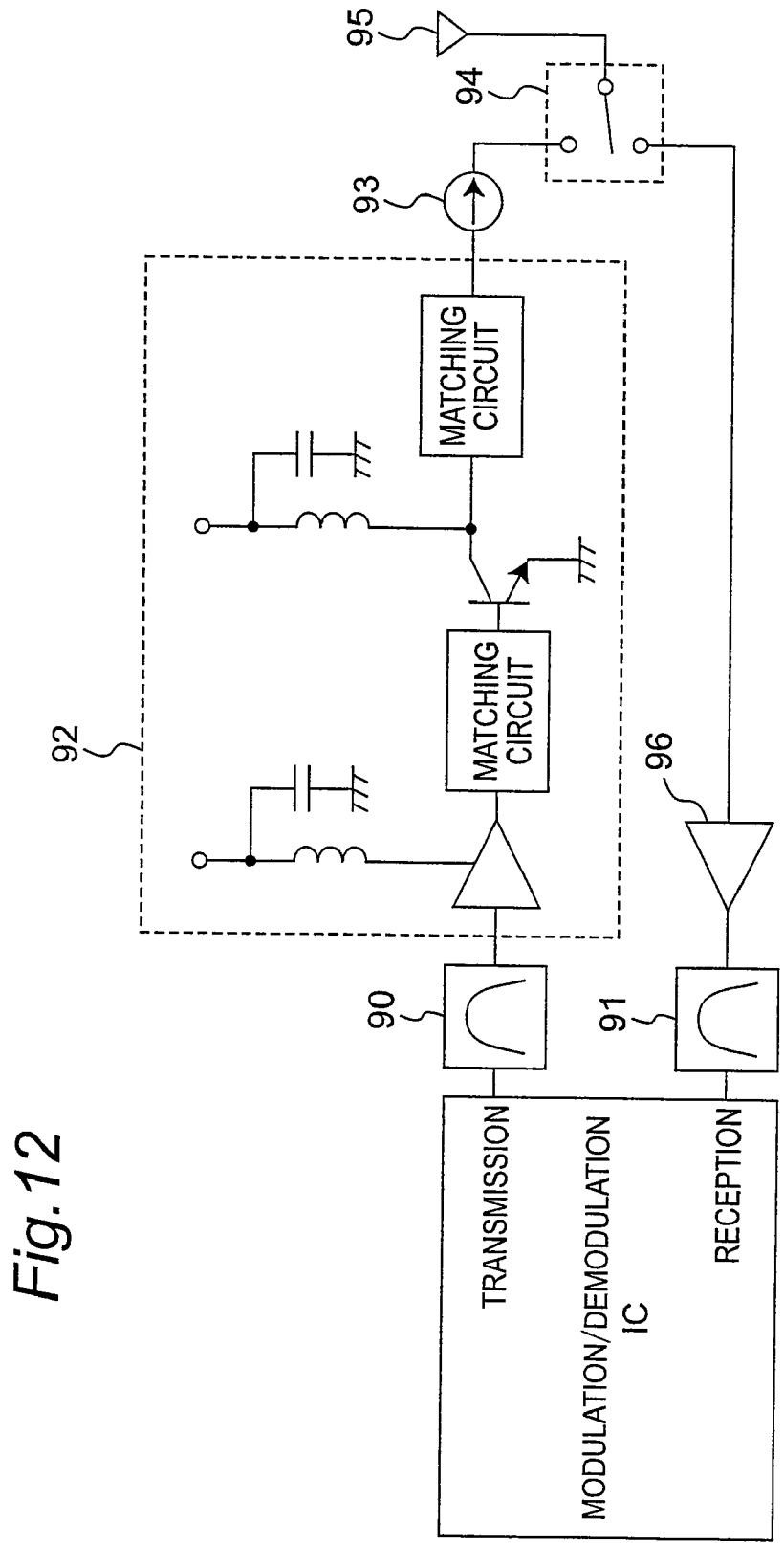
FIG. 12 is a circuit diagram of the transmitter/receiver circuit in a cell phone according to the related art.
Figure 13:
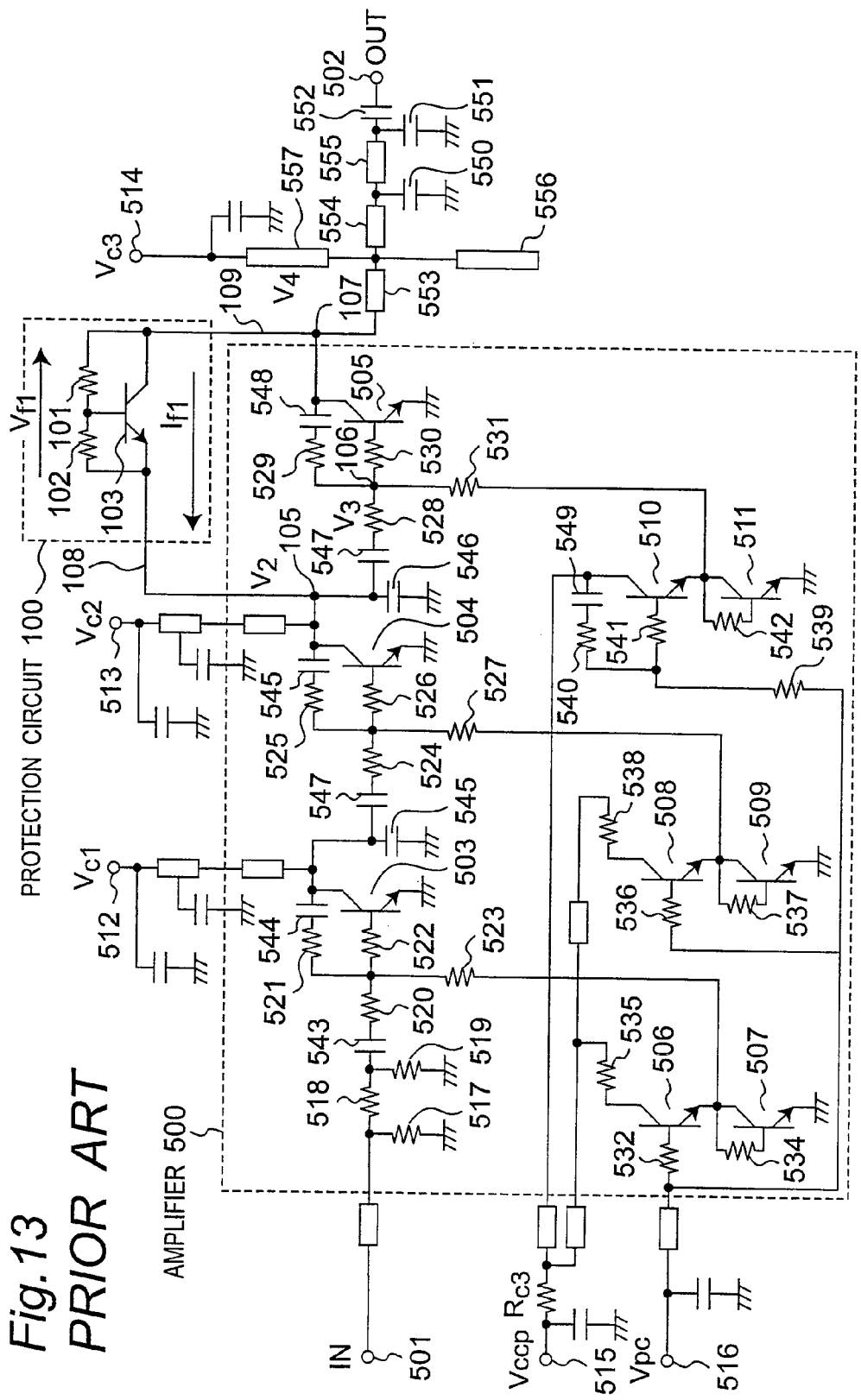
FIG. 13 is a circuit diagram showing the arrangement of a wireless frequency power amplifier according to the related art.
Figure 14:
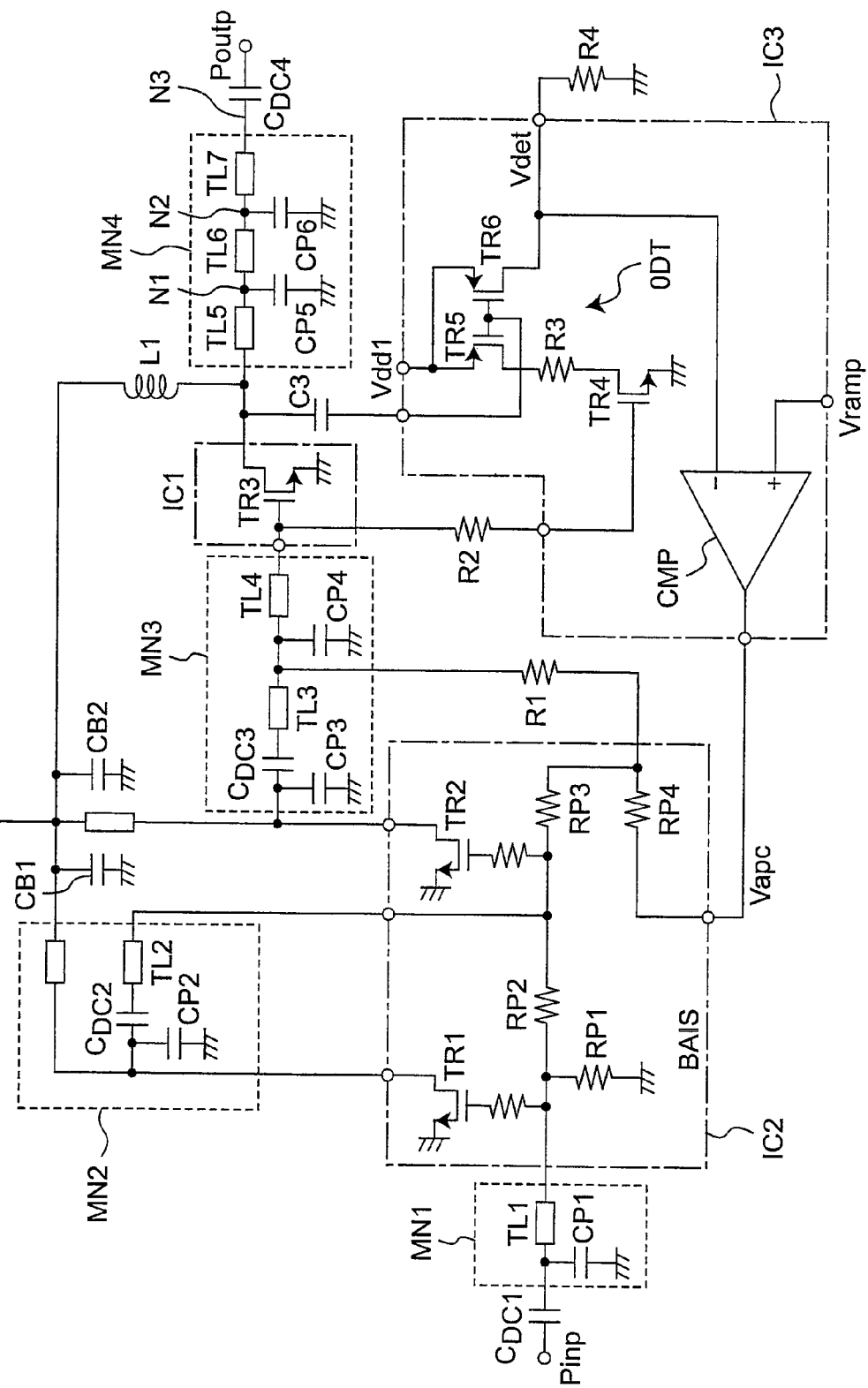
FIG. 14 is a circuit diagram showing the arrangement of a wireless frequency power amplifier according to another example of the related art.
Figure 15:
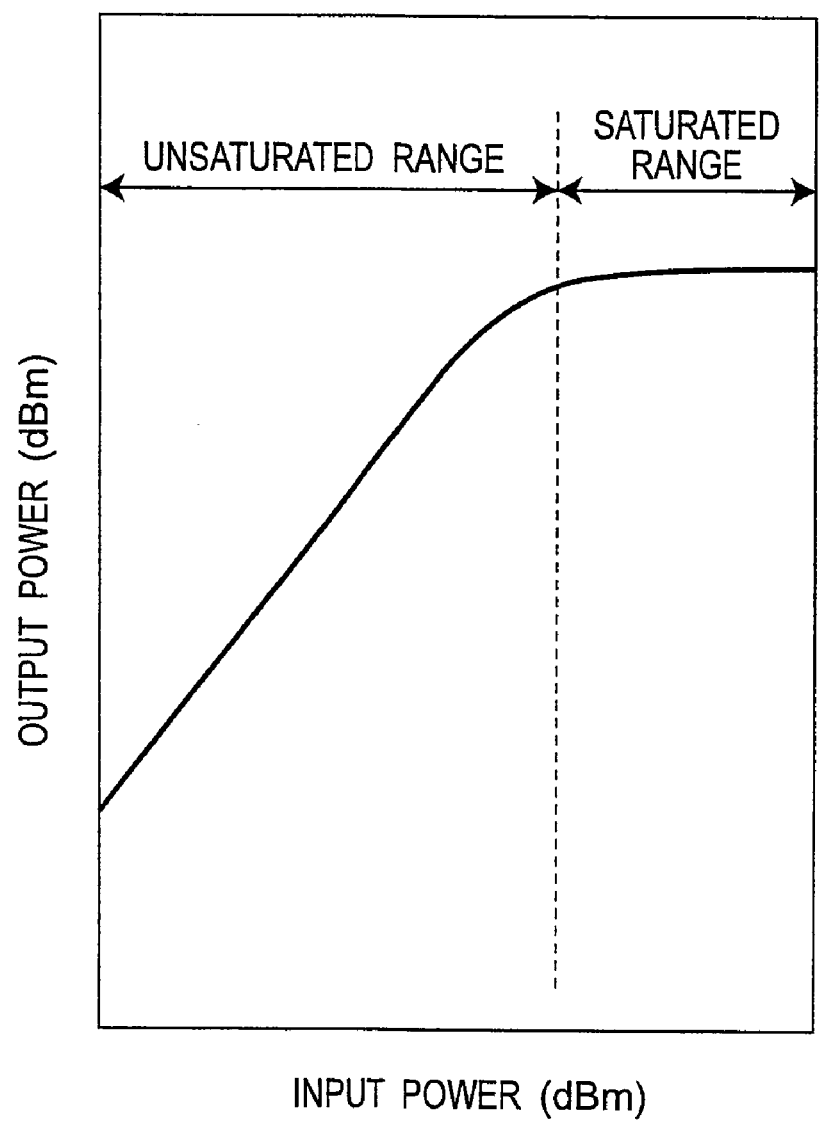
FIG. 15 is a graph showing the input/output characteristics of a wireless frequency power amplifier according to the related art.
Figure 16A:
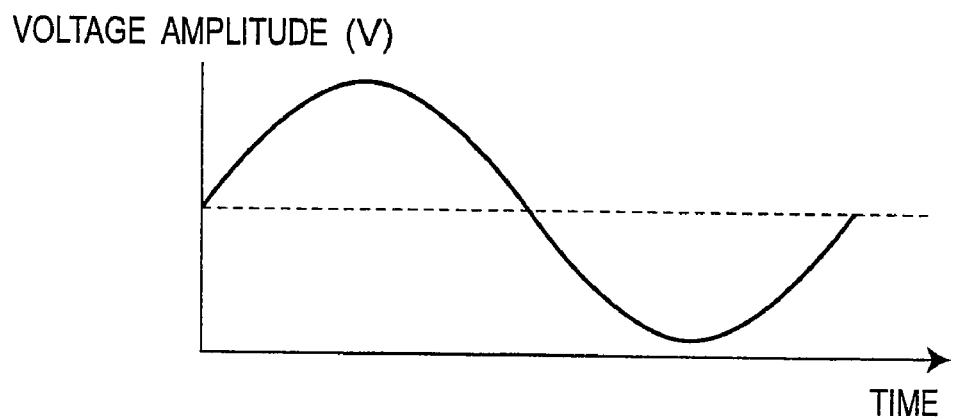
FIG. 16A is a waveform diagram showing the input/output characteristics of a wireless frequency power amplifier according to the related art.
Figure 16B:
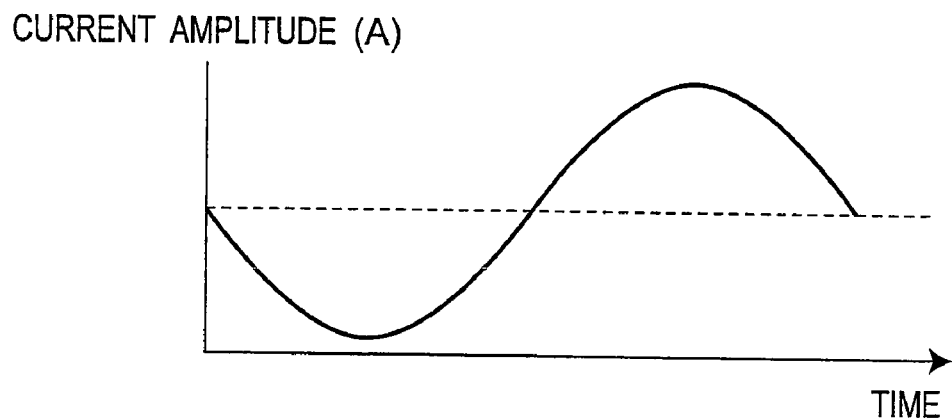
FIG. 16B is a waveform diagram showing the input/output characteristics of a wireless frequency power amplifier according to the related art.
Figure 17A:
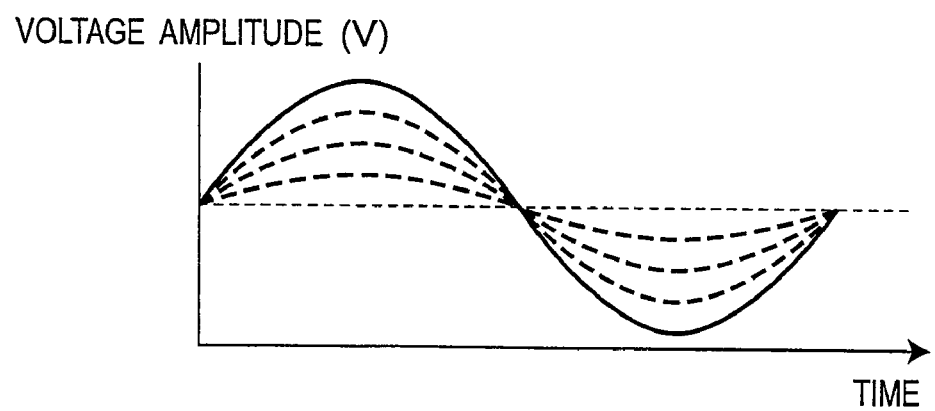
FIG. 17A is a waveform diagram showing the input/output characteristics of a wireless frequency power amplifier according to the related art.
Figure 17B:
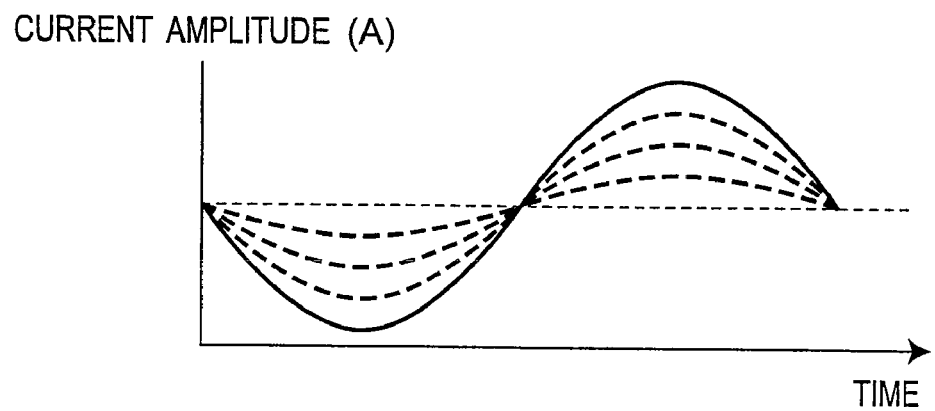
FIG. 17B is a waveform diagram showing the input/output characteristics of a wireless frequency power amplifier according to the related art.

When the drive stage 2 has a power gain characteristic as indicated by curve PG2 in FIG. 11C, the power gain of the adjustment stage 90 can be adjusted to a curve PG1 that is symmetrical to an imaginary horizontal line as shown in FIG. 11C by using the gain change detection unit 80A. More specifically, the power gain of an amplifier circuit containing the adjustment stage 90 and drive stage 2 can be held substantially constantly irrespective of the input signal as indicated by curve PG3. Because the gain change detection unit 80A operates based on the difference between the signal power at the input node 2A and the output node 2B of the drive stage 2, just the change in the power gain of the drive stage 2 can be detected without being affected by the amplitude variation of the modulation signal as described above in the first embodiment.

When the base bias currents S8A, S8, S9 are controlled using the gain change detection unit 80, comparator 6A, and base bias circuit 70C, operation of the comparator 6A causes the base bias current S8A, S8, S9 to change abruptly digitally. However, when the power gain of the adjustment stage 90 is controlled using the gain change detection unit 80A, the current level changes analogically to cancel the change in the power gain of the drive stage 2 because a comparator is not included in the control channel.

Figure 10A:
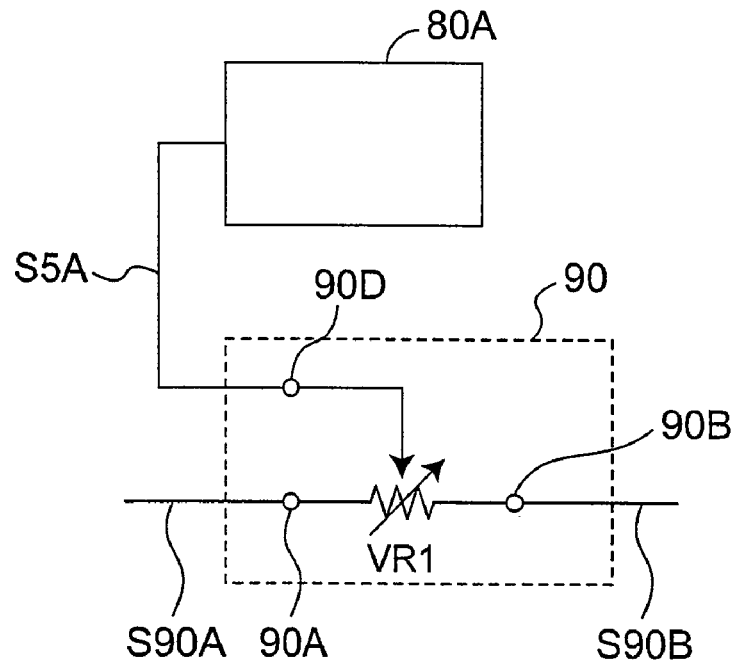
FIG. 10A is a circuit diagram showing the arrangement of a part of the wireless frequency power amplifier according to the seventh embodiment of the invention.
Figure 10B:
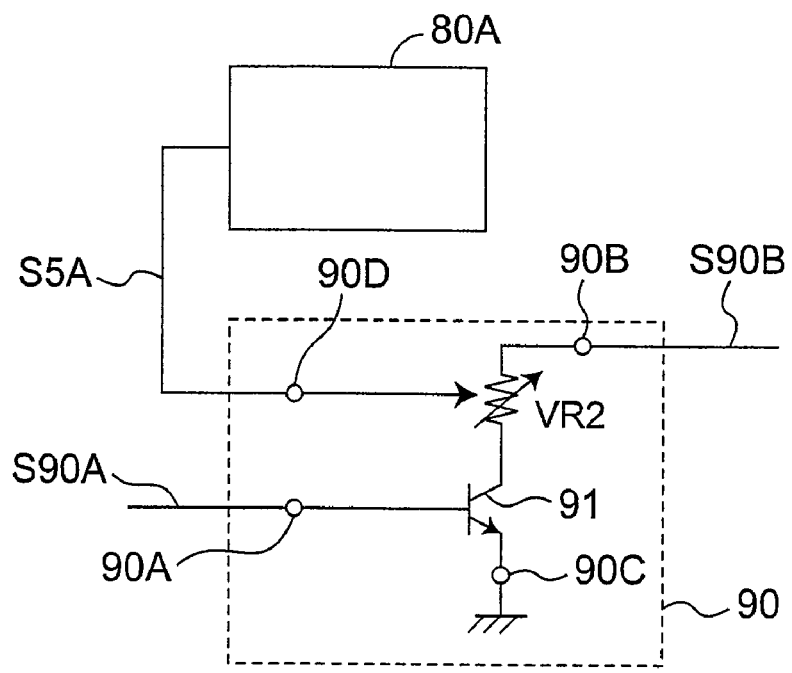
FIG. 10B is a circuit diagram showing the arrangement of a part of the wireless frequency power amplifier according to the seventh embodiment of the invention.

The adjustment stage 90 is rendered using a cascode circuit having a transistors 91 and 92 above, but as shown in FIG. 10A, a variable resistance VR1 could be connected between the input node 90A and the output node 90B of the adjustment stage 90, and the resistance of this variable resistance VR1 could be changed based on the gain change detection signal S5A. In this case the resistance of the variable resistance VR1 increases if the gain change detection signal S5A level rises so that the power gain attenuation of the adjustment stage 90 increases. On the other hand, if the gain change detection signal S5A level decreases, the resistance of variable resistance VR1 decreases to reduce power gain attenuation by the adjustment stage 90.

Further alternatively, the base of an emitter-grounded transistor 91 could be connected to the input node 90A, a variable resistance VR2 could be connected between the collector and the output node 90B, and the resistance of this variable resistance VR2 could be adjusted based on the gain change detection signal S5A. In this case the resistance of the variable resistance VR2 is reduced when the gain change detection signal S5A level rises to reduce the power gain of the adjustment stage 90. If the gain change detection signal S5A level drops, the resistance of the variable resistance VR2 is increased to increase the power gain of the adjustment stage 90.

As described above, the wireless frequency power amplifier according to this seventh embodiment of the invention detects change in the power gain of the final stage 1 by using a gain change detection unit 80, and uses a base bias circuit 70C to quickly limit the level of the base bias current S8A, S8, S9 input to the adjustment stage 90, the drive stage 2, and the final stage 1 based on the detected change in power gain. The effect of amplitude variation in the modulation signal does not appear, and only the effect of variation in the load at the output of the final stage 1 appears in the change in the power gain of the final stage 1. An overcurrent and overvoltage in the final stage 1 can therefore be avoided even when there is a sudden change in the load at the output of the final stage 1, and thermal failure or destruction of the wireless frequency power amplifier can be prevented.

As also described above, the wireless frequency power amplifier according to this seventh embodiment of the invention detects change in the power gain at the drive stage 2 by using a gain change detection unit 80A, and by using an adjustment stage 90 can adjust the power gain of the adjustment stage 90 to cancel the change in the power gain of the drive stage 2 based on the detected change in the drive stage 2 power gain. As a result, the change in the power gain of an amplifier circuit combining the adjustment stage 90 and the drive stage 2 can be held substantially constant irrespective of the input signal level. As a result, even if the drive stage 2 is driven in a class B mode, the linearity of the power gain to the input signal can be maintained, and the low power consumption of class B operation can be achieved with high linearity comparable to class A operation. The arrangement for detecting the change in the power gain of the drive stage 2 by the gain change detection unit 80A and adjusting the power gain of the adjustment stage 90 is a negative feedback circuit that can reduce fluctuations caused by manufacturing variations and variations in the thermal characteristics of the internal components of the negative feedback circuit, and can provide stable compensation for power gain fluctuations.

The wireless frequency power amplifier according to the seventh embodiment of the invention can prevent deterioration in the linearity of the final stage 1 caused by load variation at the output of the final stage 1, and can prevent deterioration of the linearity of the drive stage 2 accompanying class B operation of the drive stage 2. The wireless frequency power amplifier can therefore improve the modulation precision of CDMA and other modulation signals containing amplitude variation while also reducing leakage of high harmonic distortion components to adjacent channels, and thus provides high transmission quality.

The comparator 6A and base bias circuit 70C render a control unit in this embodiment of the invention. The adjustment stage 90, the drive stage 2, the final stage 1, the gain change detection unit 80, the gain change detection unit 80A, and the control unit of the seventh embodiment can be rendered on a single semiconductor chip.

Summary of the Embodiments

As described above, the wireless frequency power amplifier according a preferred embodiment of the invention has a detection circuit 3 and a detection circuit 4 respectively connected to the input node 1A and the output node 1B of the final stage 1. The detector output signals S3 and S4 respectively output by the detection circuits 3 and 4 are input to a differential amplifier circuit 5, which generates a gain change detection signal S5 denoting the difference between the detector output signals S3 and S4. When the wireless frequency power amplifier is terminated at 50Ω, the signal level of detector output signals S3 and S4 changes when the amplifier input signal Terminal changes, but the gain change detection signal S5 remains substantially zero as long as the power gain of the final stage 1 is constant.

However, if the load termination at the output of the wireless frequency power amplifier (that is, the impedance of the antenna) changes, the power gain of the final stage 1 changes. A reflection signal produced when the load changes can also be observed at the output node 1B. However, this occurrences at the output node 1B have no effect on the input node 1A of the final stage 1. More specifically, while a difference in the detected signal levels at the input node 1A and output node 1B of the final stage 1 does not occur in response to amplitude variation in the input signal, a difference does occur when the load varies and it is therefore possible to detect only the load variation.

The comparator 6A in a wireless frequency power amplifier according to another aspect of the invention compares the signal level with a reference voltage VrefA. A change in load is monitored in the differential amplifier circuit 5, and the comparator 6A determines if the gain change detection signal S5 exceeds the reference voltage VrefA. If it does, the comparator 6A outputs comparator output voltage S6A, and an overcurrent and overvoltage is avoided at the output node 1B of the final stage 1 by limiting or cutting off the base bias current S9 supplied from the base bias circuit 70A to the input node 1A of the final stage 1.

In the wireless frequency power amplifier according to another aspect of the invention, current is supplied from the battery 73 to the final stage 1 through a regulator circuit 72. Operation of the final stage 1 can be completely stopped by the regulator circuit 72 unconditionally interrupting the current supplied to the final stage 1. For example, if an extremely high impedance fluctuation occurs because the antenna broke, there is no expectation that operation will recover. The final stage therefore oscillates wildly, a collector current exceeding the allowable range flows, and overcurrent flows through the battery, and thermal failure of the signal lines results. Damage in such cases can be prevented by using the regulator circuit 72 when the base bias circuit 70A cannot completely stop operation of the final stage 1.

In the wireless frequency power amplifier according to another aspect of the invention a stabilization circuit 28 that changes the resistance is connected to the input node 1A of the final stage 1. Because the resistance of the stabilization circuit 28 changes when the power gain of the final stage 1 increases due to variation in the load impedance, abnormal oscillation can be suppressed and operation of the wireless frequency power amplifier can be stabilized.

In the wireless frequency power amplifier according to yet another aspect of the invention, the signal level input to the final stage 1 can be changed by controlling the gain of the drive stage 2 to maintain the linearity of the wireless frequency power amplifier when the load variation is relatively small with a voltage standing wave ratio (VSWR) not exceeding 3:1 as observed from the wireless frequency power amplifier.

In the wireless frequency power amplifier according to yet another aspect of the invention, the impedance of an impedance conversion circuit 53 connected between the matching circuit 7 and the amplifier output node P2 changes when the comparator output voltage S6A is output. As a result, the wireless frequency power amplifier can operate stably even when the load impedance changes.

In the wireless frequency power amplifier according to yet another aspect of the invention, a wireless frequency switch 64 that can switch the output path between two or more channels is disposed to the output node of the matching circuit 7. When the comparator output voltage S6A is output the wireless frequency switch 64 switches so that an output channel to an antenna with good impedance termination is always selected. Operation of the wireless frequency power amplifier can therefore be stabilized, and transmission quality can be improved.

The detection circuits 3 and 4 according to another aspect of the invention the resistance is temperature dependent to accommodate temperature fluctuations even when the power gain of the final stage 1 changes due a temperature change. As a result, the variation in the load impedance can be correctly output from the differential amplifier circuit 5 even when the temperature fluctuates.

The stabilization circuit 28 according to another aspect of the invention has sub-stabilization circuits 28A and 28B with a shunt configuration containing at least two sets of resistance and capacitance, and by using at least one set fixed can absorb sudden changes in power gain and noise that occur at the moment the stabilization circuit switches.

In the wireless frequency power amplifier according to yet another aspect of the invention, an impedance conversion circuit 53 has a transmission path 54 with a real impedance of 50Ω, and at least one set of a capacitance 55 and a serially connected switching transistor 56. The electrical length of the transmission path 54, the insertion position of the capacitance 55 and switching transistor 56, and the capacitance of the capacitor 55 are predetermined according to the impedance to be converted. When the comparator output voltage S6A is output, the desired impedance is selected by turning the switching transistor 56 on.

As described above, by using a gain change detection unit 80 in a wireless frequency power amplifier that amplifies a W-CDMA or other digital modulation signal having amplitude variation in the modulation signal, the embodiments of the invention can detect change in the power gain of the final stage 1. More specifically, variation in the power output caused by the amplitude variation of the modulation signal can be separated from variation in the power output caused by a change in the antenna impedance so that only the change in the load impedance can be detected. By detecting the change in load impedance, a control unit can be used to control the amplification operation of the wireless frequency power amplifier, and operation of the final stage 1 and the wireless frequency power amplifier can be stabilized. As a result, the wireless frequency power amplifier can be protected from damage due to large power fluctuations caused by load fluctuation without using an isolator or other component with directivity, and a wireless frequency power amplifier that is small, lightweight and operates stably with low power consumption can thus be provided.

Furthermore, because degraded modulation precision due to variable load impedance and increased distortion in the signal wave can be prevented from adversely affecting adjacent channels, a wireless frequency power amplifier with high signal transmission quality can be provided.

Furthermore, the invention can detect change in the power gain of the drive stage 2 by using a gain change detection unit 80A, and by also using a adjustment stage 90 can adjust the power gain of the adjustment stage 90 based on the change in the power gain of the drive stage 2 so that the change in the power gain of the drive stage 2 is cancelled. As a result, the change in the power gain of an amplifier circuit combining the adjustment stage 90 and the drive stage 2 can be held substantially constant irrespective of the input signal level. As a result, even if the drive stage 2 is driven in a class B mode, the linearity of the power gain to the input signal can be maintained, and the low power consumption of class B operation can be achieved with high linearity comparable to class A operation.

Furthermore, because deterioration of the linearity of the drive stage 2 caused by class B operation of the drive stage 2 can be prevented, the modulation precision of a CDMA or other modulation signal containing amplitude variation can be improved, leakage of high harmonic distortion components to adjacent channels can be reduced, and a wireless frequency power amplifier with high transmission quality can be provided.

The arrangement for detecting the change in the power gain of the drive stage 2 by the gain change detection unit 80A and adjusting the power gain of the adjustment stage 90 is a negative feedback circuit that can reduce fluctuations caused by manufacturing variations and variations in the thermal characteristics of the internal components of the negative feedback circuit, and can provide stable compensation for power gain fluctuations.

The gain of the final stage 1 that is detected by the gain change detection unit 80, and the gain of the drive stage 2 that is detected by the gain change detection unit 80A, is at most approximately 10 to 15 dB, and detection error can be kept sufficiently low. It is therefore possible to accurately detect load fluctuation and stabilize operation of the mobile device, while also accurately detecting any gain change to improve the linearity of the wireless frequency power amplifier.

The embodiments described above control at least one of the transistor input signal S1A, transistor output signal S1B, and amplifier output signal Pout if the gain change detection signal S5 rises above a predetermined level. More specifically, the modulation signal that is controlled can be any one of these types, any two, or all three.

Bipolar transistors are used in the final stage 1, the drive stage 2, and the adjustment stage 90 in the embodiments described above, and the bipolar transistors can be silicon-germanium transistors or silicon transistors. Field-effect transistors or insulated gate bipolar transistors (IGBT) can also be used instead of bipolar transistors.

Furthermore, the final stage 1 and the drive stage 2 each only contain one transistor in the embodiments described above, but a plurality of transistors could be used.

If the final stage 1 and drive stage 2 are rendered using transistors, either the emitter or the source is typically to ground. In this case the input node is the base or gate, the output node is the collector or the drain, and the common node is the emitter or the source.

A CDMA system including W-CDMA is used in the foregoing embodiments by way of example as a digital modulation method including amplitude variation. Orthogonal frequency division multiplex (OFDM), a technology proposed for fourth-generation cell phones that is also used in wireless local area network (WLAN) and in cell phones for receiving terrestrial digital broadcast signals, is another typical example. Enhanced data GSM environment (EDGE) used primarily in Europe is another example.

A temperature detection unit that detects the temperature of the final stage 1 and outputs a temperature detection signal can also be provided. In this case the resistance 3R contained in the detection circuit 3 and the resistance 4R contained in the detection circuit 4 change according to the temperature detection signal. In addition, change in the gain of the final stage 1 due to temperature change can be compensated for by adjusting the attenuation of the detection circuits 3 and 4, and temperature change of the gain change detection signal S5 can be held to substantially zero.

It will thus be apparent that the invention can be used in a wireless frequency power amplifier, a semiconductor device, and a wireless frequency power amplification method.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A wireless frequency power amplifier comprising:
   a first amplification stage that amplifies a first modulation signal to a second modulation signal;
   a second amplification stage that amplifies the second modulation signal to a third modulation signal; and a gain change detection unit that detects change in the gain of said second amplification stage and outputs a gain change detection signal based on the second modulation signal and the third modulation signal;

wherein the gain of at least one of said first amplification stage and said second amplification stage changes based on the gain change detection signal.

2. The wireless frequency power amplifier described in claim 1, wherein said gain change detection unit generates a gain change detection signal that increases linearly as the gain increases.

3. The wireless frequency power amplifier described in claim 2, further comprising:

a matching unit that matches the input/output impedance and converts the third modulation signal to a fourth modulation signal; and a control unit that stabilizes operation of said second amplification stage by controlling at least one of the first modulation signal, second modulation signal, third modulation signal, and fourth modulation signal when the gain change detection signal exceeds a predetermined level;

wherein said gain change detection unit generates the gain change detection signal based on the second modulation signal and either one of the third modulation signal and fourth modulation signal.

4. The wireless frequency power amplifier described in claim 3, wherein said matching unit has an output node that is connectable to the antenna.

5. The wireless frequency power amplifier described in claim 3, wherein:

said first amplification stage has a first input node, a first output node, and a common node, and
the first modulation signal is input between the first input node and the common node, and the second modulation signal is output from between the first output node and the common node; and said second amplification stage has a second input node, a second output node, and a common node, and
the second modulation signal is input between the second input node and the common node, and the third modulation signal is output from between the second output node and the common node.

6. The wireless frequency power amplifier described in claim 5, wherein:

said control unit includes a bias signal generating unit that generates a bias signal supplied to at least one of the first input node and the second input node, and
cuts off the bias signal when the gain change detection signal rises above a predetermined level.

7. The wireless frequency power amplifier described in claim 5, wherein:

said control unit includes a DC power generating unit that generates DC power supplied to at least one of the first output node and the second output node, and
cuts off the DC power when the gain change detection signal rises above a predetermined level.

8. The wireless frequency power amplifier described in claim 5, wherein:

said second amplification stage includes a resistance inserted between the second input node and the common node; and
said control unit changes the level of the resistance when the gain change detection signal rises above a predetermined level.

9. The wireless frequency power amplifier described in claim 5, wherein:

said second amplification stage includes a stabilization circuit inserted between the second input node and the common node; and
said control unit lowers the impedance of said stabilization circuit when the gain change detection signal rises above a predetermined level.

10. The wireless frequency power amplifier described in claim 3, wherein:

said first amplification stage includes a variable attenuator that attenuates the gain of said first amplification stage; and
said control unit causes attenuation of the gain when the gain change detection signal rises above a predetermined level.

11. The wireless frequency power amplifier described in claim 3, wherein:

said matching unit has an impedance setting unit connected to the output node of said matching unit; and
said control unit changes the impedance of said impedance setting unit when the gain change detection signal rises above a predetermined level.

12. The wireless frequency power amplifier described in claim 11, wherein:

said impedance setting unit has
a transfer path with a characteristic impedance of approximately 50Ω, and
a capacitance and a serially connected switching device connected to the output node of said transfer path; and
said control unit turns the switching device on when the gain change detection signal rises above a predetermined level.

13. The wireless frequency power amplifier described in claim 3, wherein:

said matching unit has a switching unit connected to the output node of said matching unit;
said switching unit switches the path of the fourth modulation signal to one of at least two paths; and
said control unit changes the path when the gain change detection signal rises above a predetermined level.

14. The wireless frequency power amplifier described in claim 3, wherein:

the gain change detection signal is substantially zero when the output node of said matching unit is impedance matched.

15. The wireless frequency power amplifier described in claim 3, wherein:

said control unit has a comparison unit that compares the gain change detection signal with a predetermined value, and outputs a comparison result signal when the gain change detection signal rises above a predetermined level, and
controls based on the comparison result signal.

16. The wireless frequency power amplifier described in claim 2, further comprising:

a third amplification stage that amplifies the third modulation signal;
wherein the gain of said first amplification stage changes based on the gain change detection signal.

17. The wireless frequency power amplifier described in claim 16, wherein the gain of said first amplification stage decreases linearly as the gain change detection signal level rises, and cancels the gain change of said second amplification stage.

18. The wireless frequency power amplifier described in claim 16, wherein said third amplification stage has an output node that is connectable to the antenna.

19. The wireless frequency power amplifier described in claim 1, wherein said second amplification stage is composed of a single transistor.

20. The wireless frequency power amplifier described in claim 1, wherein said gain change detection unit comprises:
   a first detection unit that generates a first detection signal denoting the second modulation signal level;
   a second detection unit that generates a second detection signal denoting the level of either the third modulation signal or a fourth modulation signal; and
   a difference unit that generates a gain change detection signal denoting a difference signal equal to the second detection signal minus the first detection signal.

21. The wireless frequency power amplifier described in claim 20, further comprising:
   a temperature detection unit that detects the temperature of said second amplification stage and generates a temperature detection signal;
   wherein said first detection unit has a first resistance;
   said second detection unit has a second resistance; and
   said first resistance and said second resistance vary based on the temperature detection signal.

22. A semiconductor device comprising the wireless frequency power amplifier described in claim 1 on a semiconductor chip.

23. The semiconductor device described in claim 22, further comprising:
   a control unit that stabilizes operation of said second amplification stage by controlling at least one of the first modulation signal, second modulation signal, third modulation signal, and fourth modulation signal when the gain change detection signal exceeds a predetermined level.

24. A wireless frequency power amplification method comprising:
   amplifying a first modulation signal to a second modulation signal;
   amplifying the second modulation signal to a third modulation signal; and
   detecting change in the gain in amplifying to the third modulation signal and generating a gain change detection signal based on the second modulation signal and the third modulation signal;
   wherein the gain in at least one of amplifying to the second modulation signal and amplifying to the third modulation signal changes based on the gain change detection signal.

* * * * *